United States Patent

Kobayashi et al.

[11] Patent Number: 5,982,662
[45] Date of Patent: Nov. 9, 1999

[54] SEMICONDUCTOR MEMORY DEVICE WITH IMPROVED READ CHARACTERISTICS FOR DATA HAVING MULTI VALUES

[75] Inventors: Yasuhiro Kobayashi, Tottori-ken; Yoh Takano, Gifu-ken; Noriaki Kojima, Ogaki; Masanori Kajitani; Sadao Yoshikawa, both of Gifu-ken, all of Japan

[73] Assignee: Sanyo Electric Co., Ltd., Osaka, Japan

[21] Appl. No.: 08/920,366

[22] Filed: Aug. 29, 1997

[30] Foreign Application Priority Data

| Aug. 30, 1996 | [JP] | Japan | 8-230824 |
| Sep. 27, 1996 | [JP] | Japan | 8-256318 |
| Nov. 5, 1996 | [JP] | Japan | 8-292793 |
| Jan. 31, 1997 | [JP] | Japan | 9-019149 |
| Feb. 25, 1997 | [JP] | Japan | 9-041111 |
| Aug. 21, 1997 | [JP] | Japan | 9-225170 |

[51] Int. Cl.$^6$ ............................................. G11C 16/06
[52] U.S. Cl. ............................. 365/185.03; 365/185.2; 365/185.21
[58] Field of Search ..................... 365/185.03, 185.2, 365/185.21, 185.22, 185.07

[56] References Cited

U.S. PATENT DOCUMENTS

| 5,424,978 | 6/1995 | Wada et al. | 365/185.03 |
| 5,550,772 | 8/1996 | Gill | 365/185.03 |
| 5,729,492 | 3/1998 | Campardo | 365/185.21 |

*Primary Examiner*—Son Mai
*Attorney, Agent, or Firm*—Sheridan Ross P.C.

[57] ABSTRACT

A semiconductor memory device is described that has an improved read characteristics. The semiconductor memory device includes a plurality of memory cells, a reference cell, a comparator located between the memory cells and the reference cell, and a discriminator coupled to the comparator. The comparator compares the actual signal equivalent to a value of a current flowing in each of the memory cells and reference signals equivalent to a value of a current flowing in the reference cell with each other to output a comparison result signal in each of data reading operation modes. The discriminator discriminates a value of data stored in each of the memory cells based on the comparison result signal. The discriminator includes a circuit shared for discrimination of a data value in each of the data reading operation modes.

48 Claims, 23 Drawing Sheets

Fig.3 (Prior Art)

| Opreration mode | Write | Erase | Read | Stand by |
|---|---|---|---|---|
| Word line WLm (Control gate CG) | 2V | 14V–15V | 4V | 0V |
| Bit line BLm (Drain D) | 0V | 0V | 2V | 0V |
| Common source line SL (Source S) | 12V | 0V | 0V | 0V |
| Substrate 102 | 0V | 0V | 0V | 0V |

Fig.6(Prior Art)

| Opreration mode | Write | Erase | Read | Stand by |
|---|---|---|---|---|
| Word line WLm (Control gate CG) | 2V | 14V-15V | 4V | 0V |
| Bit line BLm (Drain D) | 12V | 0V | 2V | 0V |
| Common source line SL (Source S) | 0V | 0V | 0V | 0V |
| Substrate 102 | 0V | 0V | 0V | 0V |

Fig.10 (Prior Art)

| Opreration mode | Write | Erase | Read | Stand by |
|---|---|---|---|---|
| Word line WLm (Control gate CG) | 12V | 0V | 5V | 0V |
| Common drain line DL (Drain D) | 0V | 12V | 5V | 0V |
| Bit line BLm (Source S) | 5V | OPEN | 0V | 0V |
| Substrate 202 | 0V | 0V | 0V | 0V |

SEMICONDUCTOR MEMORY DEVICE WITH IMPROVED READ CHARACTERISTICS FOR DATA HAVING MULTI VALUES

BACKGROUND OF THE INVENTION

1. Field of the Invention

The present invention relates generally to a semiconductor memory device. More particularly, this invention relates to a flash EEPROM (Electrical Erasable and Programmable Read Only Memory) with improved read characteristics for data having multi values.

2. Description of the Related Art

Considerable attention has recently been given to nonvolatile semiconductor memories, such as a ferro-electric memory, EPROM (Erasable and Programmable Read Only Memory) and EEPROM (Electrically Erasable and Programmable Read Only Memory). To store data, an EPROM and EEPROM use a floating gate for storing charges and a control gate for detecting a change in threshold voltage according to the presence or absence of charges in the floating gate. EEPROMs include a flash EEPROM which can perform data erasure for the entire memory chip or partial data erasure for each of a plurality of blocks in the memory cell array. There are two general types of memory cells in a flash EEPROM: a split gate type and a stacked gate type.

1) Split Gate Memory Cell

International Publication WO92/18980 discloses a split gate flash EEPROM. FIG. 1 presents a schematic cross-sectional view illustrating a split gate memory cell 101 disclosed in this publication.

The split gate memory cell 101, which is formed on a single crystalline silicon substrate 102 having a P type conductivity, has a source S of an N type conductivity, a drain D of the N type conductivity, and a channel CH defined between the source S and drain D. The memory cell 101 further has a first insulator film 103, a floating gate FG provided on the first insulator film 103, a second insulator film 104 provided on the floating gate FG, and a control gate CG provided on the second insulator film 104. A part of the control gate CG is arranged on the channel CH via the first insulator film 103 to serve as a select gate 105.

FIG. 2 is a block diagram showing a flash EEPROM 121 having a plurality of split gate memory cells 101. The flash EEPROM 121 includes a memory cell array 122, a row decoder 123, a column decoder 124, an address pad 125, an address buffer 126, an address latch 127, a data pin 128, an input buffer 129, a group of sense amplifiers 130, an output buffer 131, a source voltage controller 132, a drain voltage controller 133, a gate voltage controller 134 and a control core circuit 140.

The memory cell array 122 has a matrix of split gate memory cells 101, a plurality of word lines WLa to WLz, each commonly connected to the control gates CG of an associated row of memory cells 101, a plurality of bit lines BLa to BLz, each commonly connected to the drains D of an associated column of memory cells 101, and a common source line SL connected to the sources S of all the memory cells 101. The word lines WLa–WLz are connected to the row decoder 123, and the bit lines BLa–BLz are connected to the column decoder 124.

The address pad 125 receives a row address and a column address supplied from an external unit (not shown) and transfers the row and column addresses to the address latch 127 via the address buffer 126. The address latch 127 transfers the latched row address to the row decoder 123 and transfers the latched column address to the column decoder 124.

The row decoder 123 selects one word line (e.g., WLm) from the word lines WLa–WLz in accordance with the row address and connects the selected word line WLm to the gate voltage controller 134. The column decoder 124 selects one bit line (e.g., BLm) from the bit lines BLa–BLz in accordance with the column address and connects the selected bit line BLm to the sense amplifier groups 130 or the drain voltage controller 133.

The gate voltage controller 134 controls the electric potential on the word line WLm, which is connected thereto via the row decoder 123, in accordance with the individual operation modes shown in FIG. 3. The drain voltage control 133 controls the electric potential on the bit line BLm, which is connected thereto via the column decoder 124, in accordance with the individual operation modes shown in FIG. 3.

The common source line SL is connected to the source voltage controller 132, which controls the electric potential on the common source line SL in accordance with the individual operation modes shown in FIG. 3.

The data pin 128 receives data supplied from the external unit (not shown) and supplies the data to the input buffer 129. The input buffer 129 transfers the data to the column decoder 124. The column decoder 124 controls the electric potential on any selected one of the bit lines BLa–BLz in accordance with that data.

Data read from an arbitrary memory cell 101 is transferred from the associated one of the bit lines BLa–BLz to the sense amplifier group 130 via the column decoder 124. The sense amplifier group 130 includes a plurality of sense amplifiers (not shown). The column decoder 124 operates to connect the selected bit line BLm to the sense amplifiers. The sense amplifier group 130 discriminates data and sends this data to the external unit via the output buffer 131 and the data pin 128.

The control core circuit 140 controls the operations of the row decoder 123, the column decoder 124, the address buffer 126, the address latch 127, the input buffer 129, the sense amplifier group 130, the output buffer 131, the source voltage controller 132, the drain voltage controller 133 and the gate voltage controller 134.

The individual operation modes (erase mode, write mode and read mode) of the flash EEPROM 121 will now be discussed referring to FIG. 3.

(a) Erase Mode

In erase mode, the electric potential on the common source line SL and all the bit lines BLa–BLz is held at the ground level (0 V). A voltage of 14 to 15 V is applied to a selected word line WLm, and the electric potentials on the non-selected word lines WLa–WL1 and WLn–WLz are kept at the ground level. Therefore, the control gates CG of the individual memory cells 101 that are connected to the selected word line WLm are pulled up to 14 to 15 V. Accordingly, data stored in all the memory cells 101 connected to the selected word line WLm are erased.

When the electric potential of the control gate CG is 14 to 15 V and the electric potentials of the source and the substrate are 0 V, a high electric field is produced between the control gate CG and the floating gate FG. Then, a Fowler-Nordheim (FN) tunnel current flows between both gates. Consequently, electrons in the floating gate FG are pulled out to the control gate CG, so that data stored in the memory cells 101 are erased. This erasing operation is based on the electrostatic capacitances between the source S and the substrate 102 and floating gate FG being significantly greater than that between the control gate CG and the floating gate FG. Simultaneous selection of a plurality of word lines in the word lines WLa–WLz permits data erasure of all the memory cells 101 connected to the selected word lines. That is, as the memory cell array 122 is divided into a plurality of blocks corresponding to plural sets of word lines WLa–WLz, data erasure can be performed on each block. This erasing operation is called "block erasure".

(b) Write Mode

In write mode, the electric potential on the selected bit line BLm is kept at the ground level, while the electric potentials on the other bit lines (non-selected bit lines) BLa–BL1 and BLn–BLz are kept at a level greater than the electric potential on the selected word line (in this case, 2 V).

A voltage of 2 V is applied to the word line WLm connected to the control gate CG of the selected memory cell 101, while the electric potentials on the other word lines (non-selected word lines) WLa–WL1 and WLn–WLz are kept at the ground level. A voltage of 12 V is applied to the common source line SL.

Consequently, the electric potential of the floating gate FG is pulled up by the capacitive coupling between the source S and the floating gate FG. This produces a high electric field between the channel CH and the floating gate FG. Then, the electrons in the channel CH are accelerated to become hot electrons. Hot electrons are supplied to the floating gate FG as indicated by the arrow A in FIG. 1. As a result, charges are stored in the floating gate FG of the selected memory cell 101 and 1-bit data is written and stored there.

In each memory cell 101, a transistor, which includes a control gate CG, source S and drain D, has a threshold voltage Vth of 0.5 V. In the selected memory cell 101, therefore, electrons in the drain D are moved in the channel CH in the inverted state. Thus the current (cell current) flows to the drain D from the source S. This writing operation, unlike the erasing operation, may be executed for each selected memory cell 101.

(c) Read Mode

In read mode, a voltage of 4 V is applied to the word line WLm connected to the control gate CG of the selected memory cell 101, and the electric potentials on the other (non-selected) word lines WLa–WL1 and WLn–WLz are held at the ground level. A voltage of 2 V is applied to the bit line BLm connected to the drain D of the selected memory cell 101, while the electric potentials on the other bit lines (non-selected bit lines) BLa–BL1 and BLn–BLz are kept at the ground level.

As a result, the current (cell current), which flows to the source S of the memory cell 101 in the erased state from the drain D thereof, becomes greater than the cell current flowing in the memory cell 101 in the written state. This is because the channel CH directly below the floating gate FG of the data-erased memory cell 101 is enabled, while the channel CH directly below the floating gate FG of the data-written memory cell 101 is disabled. This will be discussed specifically.

As electrons are drained from the floating gate FG of the data-erased memory cell 101, the floating gate FG is positively charged. Therefore, the channel CH or the memory cell is enabled, permitting the current to flow. As electrons are supplied into the floating gate FG of the data-written memory cell 101, the floating gate FG is negatively charged. Thus, the channel CH or the memory cell is disabled to prevent the flow of the current.

Each sense amplifier in the sense amplifier group 130 discriminates the level of the cell current Id flowing in the associated memory cell 101 to read a data value stored in the memory cell 101. For instance, a data value "1" is read from the memory cell 101 in the erased state, and a data value "0" is read from the memory cell 101 in the written state. In this manner, binary data having a data value "1" indicating the erased state and a data value "0" indicating the written state are stored in each memory cell 101. Unlike the erasing operation, this reading operation may be performed for each selected memory cell 101.

U.S. Pat. No. 5,029,130 discloses a flash EEPROM in which the source S is called "drain" and the drain D is called "source". FIG. 4 is a schematic cross-sectional view illustrating a split gate memory cell 110, disclosed in this publication. FIG. 5 is a block diagram showing a flash EEPROM 111 that uses the split gate memory cells 110. FIG. 6 shows electric potentials on the individual lines and the substrate in the individual operation modes of the flash EEPROM 111.

The split gate memory cell 110 in FIG. 4 differs from the split gate memory cell 101 in that the source S and drain D in the former memory cell are called by the opposite names in the latter memory cell. Specifically, the source S in the memory cell 110 is called the drain D in the memory cell 101, while the drain D in the memory cell 110 is called the source S in the memory cell 101.

The flash EEPROM 111 in FIG. 5 differs from the flash EEPROM 121 in that the common source line SL is grounded. In any operation mode, the electron potential on the source line SL is kept at the ground level.

There has been a proposal to replace the source voltage controller 132 in the flash EEPROM 121 with a source current controller. In this case, the source current controller controls the electric potential on the common source line SL in accordance with the individual operation modes as shown in FIG. 3 by controlling the cell current value Id to a given value.

It has also been proposed to replace the drain voltage controller 133 in the flash EEPROM 121 or the flash EEPROM 111 with a drain current controller. In this case, the drain current controller controls the electric potential on the bit line BLm in accordance with the individual operation modes as shown in FIG. 3 or FIG. 6 by controlling the cell current value Id to a given value.

Further, it has been proposed to design the flash EEPROM 121 so as not to connect the sources S of the whole memory cells 110 to the common source line SL, but to selectively connect the sources S of a row of memory cells 110 to the common source line. In this case, the flash EEPROM 121 is provided with a source line decoder, which selects one source line in accordance with the column address and connects the selected source line to the source voltage controller 132.

In order to improve the integration of flash EEPROMs, recently, some attempts have been made to store data having three or more values (multi value) besides storing two-value (1-bit) data in each memory cell in the erased state and the written state.

FIG. 7 presents a characteristic graph illustrating the relationship between the value of the cell current Id flowing through the split gate memory cell 101 or 110 and the electric potential Vfg of the floating gate FG. This electric potential Vfg of the floating gate FG (hereinafter referred to as "floating gate potential") indicates the electric potential of the floating gate FG with respect to the electric potential of the source S and is closely associated with the cell current. As apparent from this graph, multi-value data having four values ("00", "01", "10" and "11"), for example, can be stored in each memory cell. The floating gate potential Vfg is given by the following equation:

$$Vfg = Vfgw + Vfgc$$

where Vfgw is the electric potential that is produced by the charges stored in the floating gate FG in write mode, and Vfgc is the potential produced by the capacitive coupling with the drain D. In a read operation, the electric potential Vfgc is constant so that the cell current value Id is primarily determined by the electric potential Vfgw. In a write operation, the amount of charges in the floating gate FG may be controlled by adjusting the write operation time or the applied voltage. That is, the floating gate potential Vfg may be controlled by adjusting the write operation time or the write operation voltage to control the amount of charges in the floating gate FG. This control permits the cell current value Id in read mode to be set to an arbitrary value.

Suppose that, as shown in FIG. 7, a data value "00" is associated with the area of the cell current value Id, which is less than 40 µA, a data value "01" is associated with the area of the cell current value Id that is equal to or greater than 40 µA and less than 80 µA, a data value "10" is associated with the area of the cell current value Id that is equal to or greater than 80 µA and less than 120 µA, and a data value "11" is associated with the area of the cell current value Id that is equal to or greater than 120 µA. In this case, the write operation time is adjusted such that individual floating gate potentials Vfg (Va, Vb and Vc) corresponding to the individual cell current values Id (40 µA, 80 µA and 120 µA) in write mode are acquired.

Since electrons have been drained from the floating gate FG of a data-erased memory cell 101 or 110, that memory cell is in the same state as the state in which the data value "11" is stored. At this time, the floating gate has an electric potential Vfg equal to or greater than the electric potential Vc (2.5 V).

When the writing operation commences and charges are stored in the floating gate FG, the floating gate potential Vfg drops. If the writing operation is stopped when the floating gate potential Vfg becomes equal to or greater than Vb (1.5 V) and less than Vc (2.5 V), the data value "10" is written in the memory cell 101 or 110. If the writing operation is stopped at the time the floating gate potential Vfg becomes equal to or greater than Va (1.0 V) and less than Vb, the data value "01" is written in the memory cell 101 or 110. If the writing operation is stopped when the floating gate potential Vfg becomes less than Va, the data value "00" is written in the memory cell 101 or 110. In this manner, four-value (2-bit) data is stored in a single memory cell 101 or 111.

Since a constant voltage (4 V) is applied to the control gate CG in read mode, the channel CH serves as a constant resistor. Therefore, the transistor having the floating gate FG, the source S and the drain D are connected in series to the constant resistor (the channel CH) in the split gate memory cell 101 or 110. When the floating gate potential Vfg is less than a given value (3.5 V), therefore, the cell current value Id varies in accordance with the characteristics of the transistor.

When the floating gate potential Vfg is smaller than the threshold voltage Vth (0.5 V) of the transistor in the memory cell 101 or 110, which has the floating gate FG, the source S and the drain D, the cell current value Id is 0. When the floating gate potential Vfg exceeds the threshold voltage Vth, the cell current value Id increases (See FIG. 7). When the floating gate potential Vfg exceeds 3.5 V, the cell current value Id is saturated due to the dominance of the constant resistor (the channel CH).

2) Stacked Gate Memory Cell

FIG. 8 is a schematic cross-sectional view showing a stacked gate memory cell 201. The stacked gate memory cell 201 has a source S and a drain D both having an N type conductivity and defined on a single crystalline silicon substrate 202 having a P type conductivity, and a channel CH defined between the source S and the drain D. The stacked gate memory cell 201 further has a first insulator film 203, a floating gate FG arranged on the first insulator film 203, a second insulator film 204 arranged on the floating gate FG, and a control gate CG arranged on the second insulator film 204. The floating gate FG and the control gate CG are stacked one on the other without being deviating from each other. Therefore, the source S and the drain D are symmetrical to the gates FG and CG and the channel CH.

FIG. 9 is a block diagram showing a flash EEPROM 221 having a plurality of stacked gate memory cells 201. This flash EEPROM 221 differs from the flash EEPROM 121 using the split gate memory cells 101 shown in FIG. 1 in the following points:

(1) The memory cell array 122 has a plurality of stacked gate memory cells 201 arranged in a matrix form.

(2) The sources S of the individual memory cells 201 aligned in individual columns are commonly connected to the associated bit lines BLa–BLz.

(3) The drains D of all the memory cells 201 are connected to a common drain line DL, which is connected to a common drain line bias circuit 222. The bias circuit 222 controls the electric potential on the common drain line DL in accordance with the individual operation mode under the control of the control core circuit 140.

The names for the sources S and the drains D of the split gate memory cell 101 and the stacked gate memory cell 201 are determined based on the reading operation; the terminal to which a high electric potential is applied in the reading operation is called a "drain" while the terminal to which a low electric potential is applied is called a "source". The same applies to the names for those terminals, the source S or the drain D, in the writing operation and the erasing operation.

The individual operation modes (erase mode, write mode and read mode) of the flash EEPROM 221 will now be discussed referring to FIG. 10.

(a) Erase Mode

In erase mode, all the bit lines BLa–BLz are set in the open state and the electric potential on the selected word line WLm is kept at the ground level. The common drain line bias circuit 222 applies a voltage of 12 V to the drains D of the memory cells 201, connected to the selected word line WLm, via the common drain line DL. As a result, the FN tunnel current flows, and the electrons in the floating gates FG are drained toward the drains D, so that data stored in the memory cells 201 are erased. This erasing operation is executed for all the memory cells 201 connected to the selected word line WLm. By selecting a plurality of word lines in the word lines WLa–WLz, data in all the memory cells 201 connected to those selected word lines may be erased (block erasure).

(b) Write Mode

In write mode, a voltage of 12 V is applied to the word line WLm that is connected to the control gate CG of the selected memory cell 201, and the electric potentials on the other word lines (the non-selected word lines) WLa–WL1 and WLn–WLz are kept at the ground level. A voltage of 5 V is applied to the bit line BLm connected to the source S of the selected memory cell 201, and the electric potentials on the other bit lines (the non-selected bit lines) BLa–BLl and BLn–BLz are kept at the ground level. The common drain line bias circuit 222 holds the electric potentials of the drains D of all the memory cells 201 at the ground level via the common drain line DL.

Then, the capacitive coupling with the control gates CG pulls up the electric potentials of the floating gates FG and causes hot electrons produced in the vicinity of the sources S to be supplied into the floating gates FG. As a result, charges are stored in the floating gate FG of the selected memory cell 201 and 1-bit data is written and stored there.

(c) Read Mode

In the read mode, a voltage of 5 V is applied to the word line WLm connected to the control gate CG of the selected memory cell 201, while the electric potentials on the other words lines (the non-selected word lines) WLa–WLl and WLn–WLz are held at the ground level. The electric potentials on all the bit lines BLa–BLz are kept at the ground level. The common drain line bias circuit 222 applies a voltage of 5 V to the drains D of all the memory cells 201 via the common drain line DL.

As a result, the cell current, which flows to the source S of any data-erased memory cell 201 from the drain D thereof, becomes greater than the cell current flowing in any data-written memory cell 201 as in the case of the split gate memory cell 101. It is thus possible to store two values, the data value "1" in the erased state and the data value "0" in the written state, in each memory cell 201.

A flash EEPROM using stacked gate memory cells 201 that store multi-value data has been proposed. FIG. 11 presents a characteristic graph illustrating the relationship between the value of the cell current Id flowing through the stacked gate memory cell 201 and the electric potential Vfg of the floating gate FG. The floating gate potential Vfg is the electric potential of the floating gate with respect to the electric potential of the source S.

In the stacked gate memory cell 201, the floating gate FG and the control gate CG are stacked on one another in alignment. In the stacked gate memory cell 201, unlike in the split gate memory cell 101, the channel CH does not serve as a constant resistor but has only the function of a transistor. When the floating gate potential Vfg is less than the threshold voltage Vth (1 V) of the memory cell 201, therefore, the cell current value Id become zero. When the floating gate potential Vfg exceeds the threshold voltage Vth, the cell current value Id is positively proportional to the floating gate potential Vfg, and multi-value data may be stored in the memory cell.

Even in the stacked gate memory cell 201, therefore, the floating gate potential Vfg is controlled by adjusting the write operation time or the applied voltage to control the amount of charges of the floating gate FG or the electric potential Vfg.

Suppose that, as shown in FIG. 11, the data value "00" is associated with the area of the cell current value Id which is less than 40 $\mu$A, the data value "01" is associated with the area of the cell current value Id that is equal to or greater than 40 $\mu$A and less than 80 $\mu$A, the data value "10" is associated with the area of the cell current value Id that is equal to or greater than 80 $\mu$A and less than 120 $\mu$A, and the data value "11" is associated with the area of the cell current value Id that is equal to or greater than 120 $\mu$A and less than 160 $\mu$A. In this case, the write operation time is adjusted in such a way that individual floating gate potentials Vfg (Va, Vb, Vc and Vd) respectively correspond to the individual cell current values Id (40 $\mu$A, 80 $\mu$A, 120 $\mu$A and 160 $\mu$A). In this manner, four-value (2-bit) data may be stored in a single memory cell 201.

To accurately write data in the multi-value storing operation of a flash EEPROM, it is essential to precisely control the floating gate potential Vfg of the memory cell 101, 110 or 201 in write mode. That is, it is important to accurately set the floating gate potential Vfg of the memory cell after writing to the desired value. For example, Japanese Unexamined Patent Publication No. 4-57294 discloses a currently popular verify write technique.

The verify write technique first performs writing to memory cells 101, 110 or 201 for a given time (several hundred nanoseconds to several microseconds) and then performs a read operation for verification (verify read operation). In the subsequent writing operation, the data value to be written is compared with the data value that has been read in the read operation (comparing operation). The read data value is what has actually been written in the writing operation. When the data value to be written and the read data value do not match with each other, writing is executed again for a given time. The cycle of the writing operation, the verify read operation and the comparison is repeated until both data values match.

In the above-described non-volatile semiconductor memory, a data value that has been written is discriminated by comparing a read data value (the value of the current flowing in a memory cell) with a reference data value in the verify read operation.

The reference data value is generated by using a circuit that has a reference cell as shown in, for example, FIG. 12. FIG. 12 shows a circuit which is adapted for reading data from the memory cells 101 of the split gate flash EEPROM adapted for data writing and data reading. In general, the discrimination of 4-value data requires seven types of threshold values, namely, a threshold value E for verify read determination in erase mode, threshold values R1 to R3 for normal read determination, and threshold values P1 to P3 for verify read determination in write mode.

FIG. 13 shows the distribution of the cell current that an EEPROM for 4-value data requires. Although the cell current varies cell by cell, the cell current of each cell should fall within four ranges corresponding to four values. For this purpose, seven types of threshold values are set between the individual current ranges.

The circuit in FIG. 12 has seven reference cells 301 to 307 associated with the seven threshold values needed for reading and determining 4-value data and a reference cell switching circuit 308 for selectively connecting the reference cell necessary for each operation to a sense amplifier circuit 309.

The sense amplifier circuit 309 compares the reference current, which is produced in the selected reference cell, with the actual current that flows through the memory cell 101 of interest and outputs the comparison result. When the reference current is equal to or larger than the real current, for example, a signal of an H (High) level is output. When the reference current is less than the real current, a signal of an L (Low) level is output. This sense amplifier circuit 309 is incorporated in the sense amplifier group 130. In FIG. 12, the column decoder 124 located between the memory cells 101 and the sense amplifier circuit 309 is omitted for simplifying this description.

The circuit in FIG. 12 further comprises a reference potential generator 310 for applying voltages to the floating gates FG of the reference cells 301–307. This generator 310 is provided to easily acquire from the reference cells the currents used as references for the determination in read mode. The voltages generated by this generator 310 are not applied to the memory cells 101 or 110. Note that there is a case where a stacked gate flash EEPROM uses ordinary MOS transistors that do not have floating gates as reference cells.

To directly apply a voltage to the floating gate FG, the reference cells 301–307 in the prior art are formed with different shapes and in a different process from those of the actual memory cells 101. Even if the reference cells 301–307 are designed strictly, the formed reference cells would have characteristics little different from those of the actual memory cells due to a slight process variation. This variation in characteristics does not raise a significant problem in a binary memory, which affords a large margin for the threshold values for data determination. In a multi-value memory, which cannot afford a large margin for the threshold values for data determination, however, such a variation may raise a problem like an error in data discrimination based on the threshold values or the occurrence of an undiscriminatable state. This problem becomes more serious as the number of values in multi-value data increases.

SUMMARY OF THE INVENTION

It is an objective of the present invention to provide a semiconductor memory device having an improved read characteristic. The present invention can be implemented in numerous ways including as an apparatus and a method.

A first embodiment of the present invention pertains to a semiconductor memory device having a plurality of data reading operation modes. The semiconductor memory device includes a plurality of memory cells for storing data having predetermined values; a reference cell, a current being permitted to flow in the memory cells and the reference cell when a predetermined voltage is applied thereto; a comparator located between the memory cells and the reference cell; and a discriminator coupled to the comparator. The comparator produces an actual signal equivalent to a value of a current flowing in each of the memory cells and a reference signal equivalent to a value of a current flowing in the reference cell and compares the actual and reference signals with each other to output a comparison result signal in each of the data reading operation modes. The discriminator discriminates a value of data stored in each of the memory cells based on the comparison result signal. The discriminator includes a circuit shared for discrimination of a data value in each of the data reading operation modes.

A second embodiment of the invention pertains to a semiconductor memory device having a plurality of data reading operation modes. The semiconductor memory device includes a plurality of memory cells for storing data; a reference cell having a same size as the memory cells, a current being permitted to flow in the memory cells and the reference cell when a predetermined voltage is applied thereto; and a comparator located between the memory cells and the reference cell. The comparator produces an actual signal equivalent to a value of a current flowing in each of the memory cells and a reference signal equivalent to a value of a current flowing in the reference cell and compares the actual and reference signals with each other to output a comparison result signal in each of the data reading operation modes. The comparator includes a comparator circuit, which is shared for each of the data reading operation modes, generates and compares the actual and reference signals with each other.

A third embodiment of the present invention pertains to a semiconductor memory device for writing multi-value data. The semiconductor memory device includes a plurality of memory cells for storing multi-value data; a reference cell having a same size as the memory cells, a current being permitted to flow in the memory cells and the reference cell when a predetermined voltage is applied thereto; and a comparator located between the memory cells and the reference cell. The comparator produces an actual signal equivalent to a value of a current flowing in each of the memory cells and a reference signal equivalent to a value of a current flowing in the reference cell and compares the actual and reference signals with each other to output a comparison result signal in a data reading mode. The comparator includes a plurality of generator circuits for generating threshold values used for determination of value of multi-value data and a comparator circuit coupled to the plurality of generator circuits. The generator circuits compare the threshold values and the actual signal and output a comparison result signal as a signal representing one value of the multi-value data stored in each of the memory cells.

In this invention, an actual signal equivalent to the value of the current flowing in a memory cell represents the current which flows in a memory cell, a signal correlated with this current, a signal which is produced based on that current. In this invention, likewise, a reference signal equivalent to the value of the current flowing in a reference cell represent the current which flows in a reference cell, a signal correlated with this current, a signal which is produced based on that current. A plurality of data read modes means at least two of, for example, the normal reading operation, the verify read operation at the time of writing, the verify read operation at the time of erasure, and the like. Further, "at the time of reading data" in this invention means at a time of at least one of a plurality of data read modes.

This invention has the following advantages. Since a reference cell is designed to have the same size and same shape as memory cells, the differences in the characteristics between the cells are reduced. Both cells are fabricated in the same manufacturing process. Since a plurality of comparison circuits are arranged in parallel as viewed from the memory cells, data of a plurality of levels written in the memory cells may be discriminated at a given time. Further, a plurality of data values are discriminated at a given time using the reference cell in common. Because a plurality of comparators associated with a plurality of data read modes are selectively enabled, the current consumption is reduced. Data is easily discriminated by using a discriminating circuit that converts a signal for discriminating $2^n$-value data to n-bit data. A plurality of written states are determined by one comparison circuit. Since the discriminating device is shared for a plurality of data read modes, the circuit structure and the circuit scale of the discriminating device itself are reduced. The sharing of the discriminating device is based on the fact that the plurality of individual data read modes are not performed simultaneously.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a diagram showing applied voltages in individual operation modes of the flash EEPROM in FIG. 2;

FIG. 6 is a diagram showing applied voltages in individual operation modes of the flash EEPROM in FIG. 5;

FIG. 10 is a diagram showing applied voltages in individual operation modes of the flash EEPROM in FIG. 9;

DETAILED DESCRIPTION OF THE PREFERRED EMBODIMENTS

First Embodiment

Figure 14:
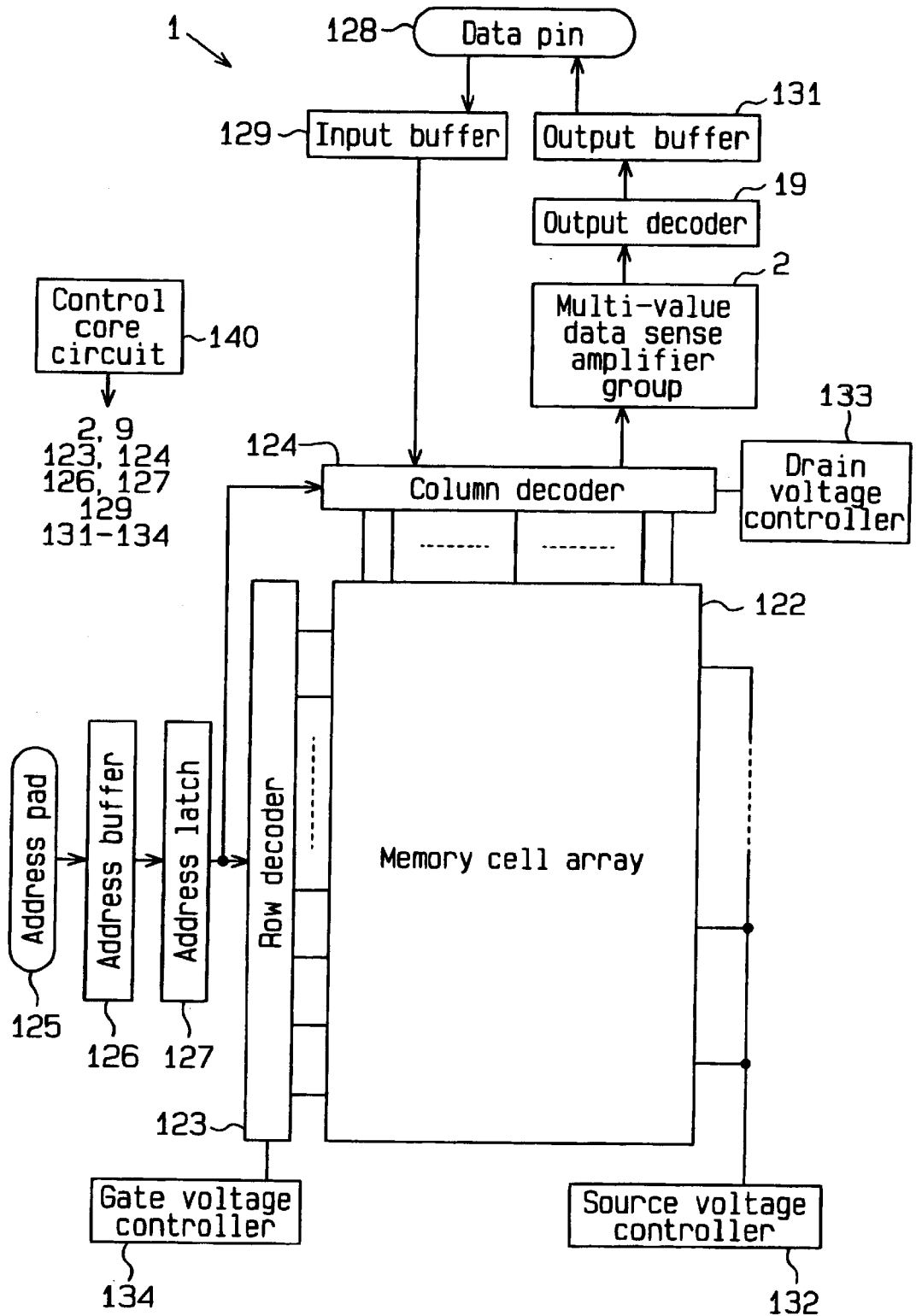
FIG. 14 is a block circuit diagram illustrating a flash EEPROM according to a first embodiment of this invention.

The first embodiment of the present invention will now be described referring to FIGS. 14 to 16. To avoid redundancy, like or same reference numerals are given to those components that are the same as the corresponding components of the prior art. FIG. 14 is a block diagram showing a split gate flash EEPROM 1, which ensures writing and reading of 4-value data.

Figure 1:
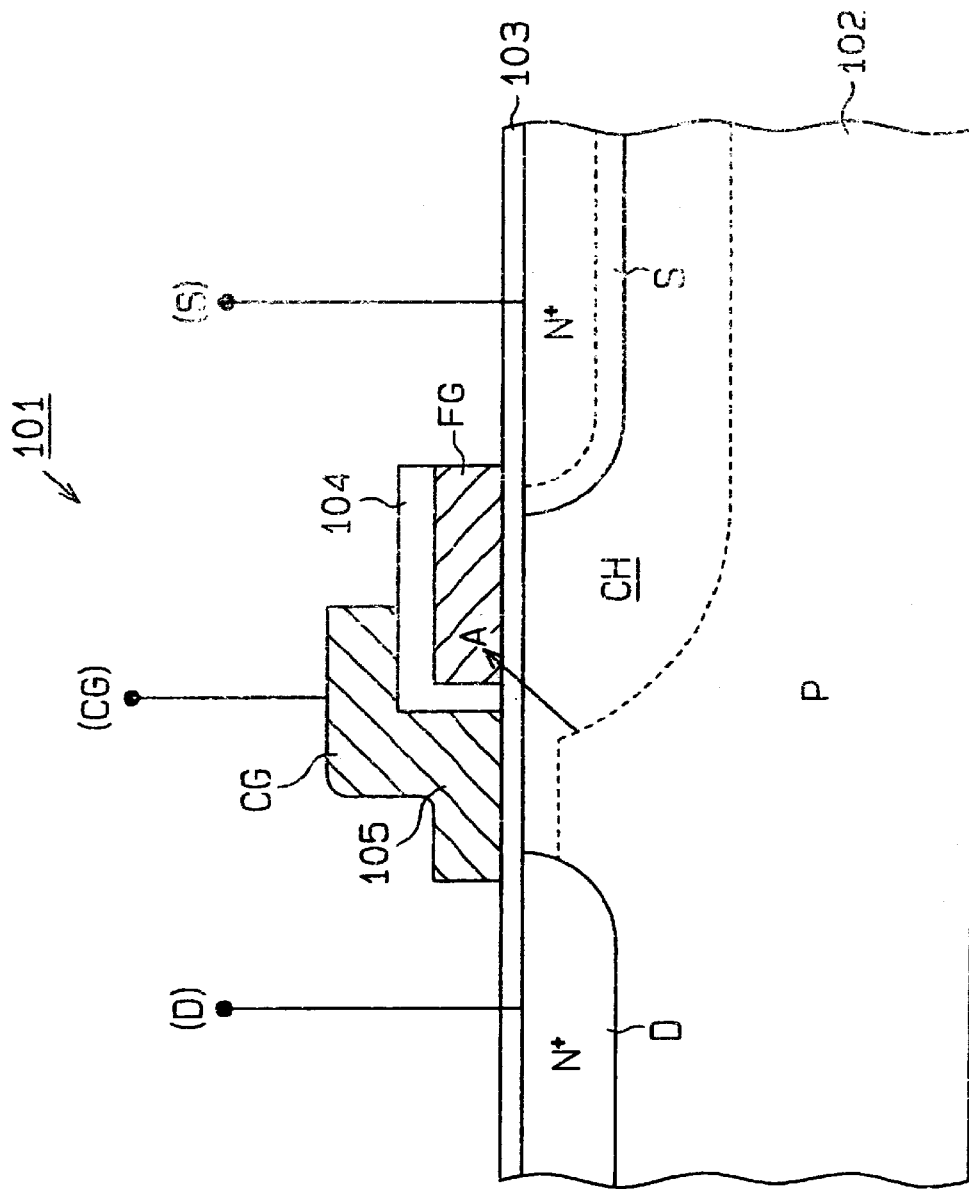
FIG. 1 is a schematic cross-sectional view of a split gate memory cell.
Figure 2:
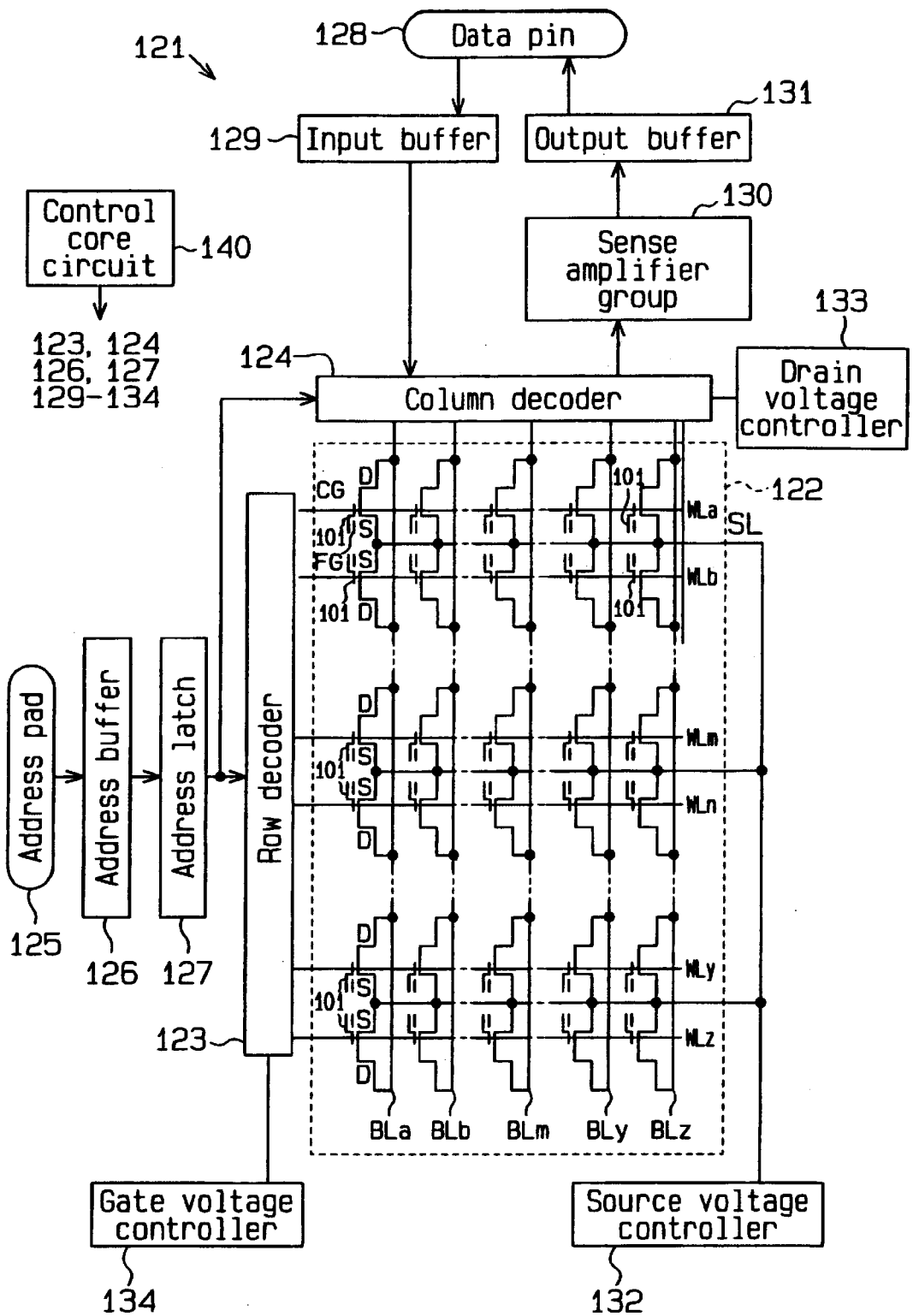
FIG. 2 is a block diagram illustrating a conventional split gate flash EEPROM.
Figure 4:
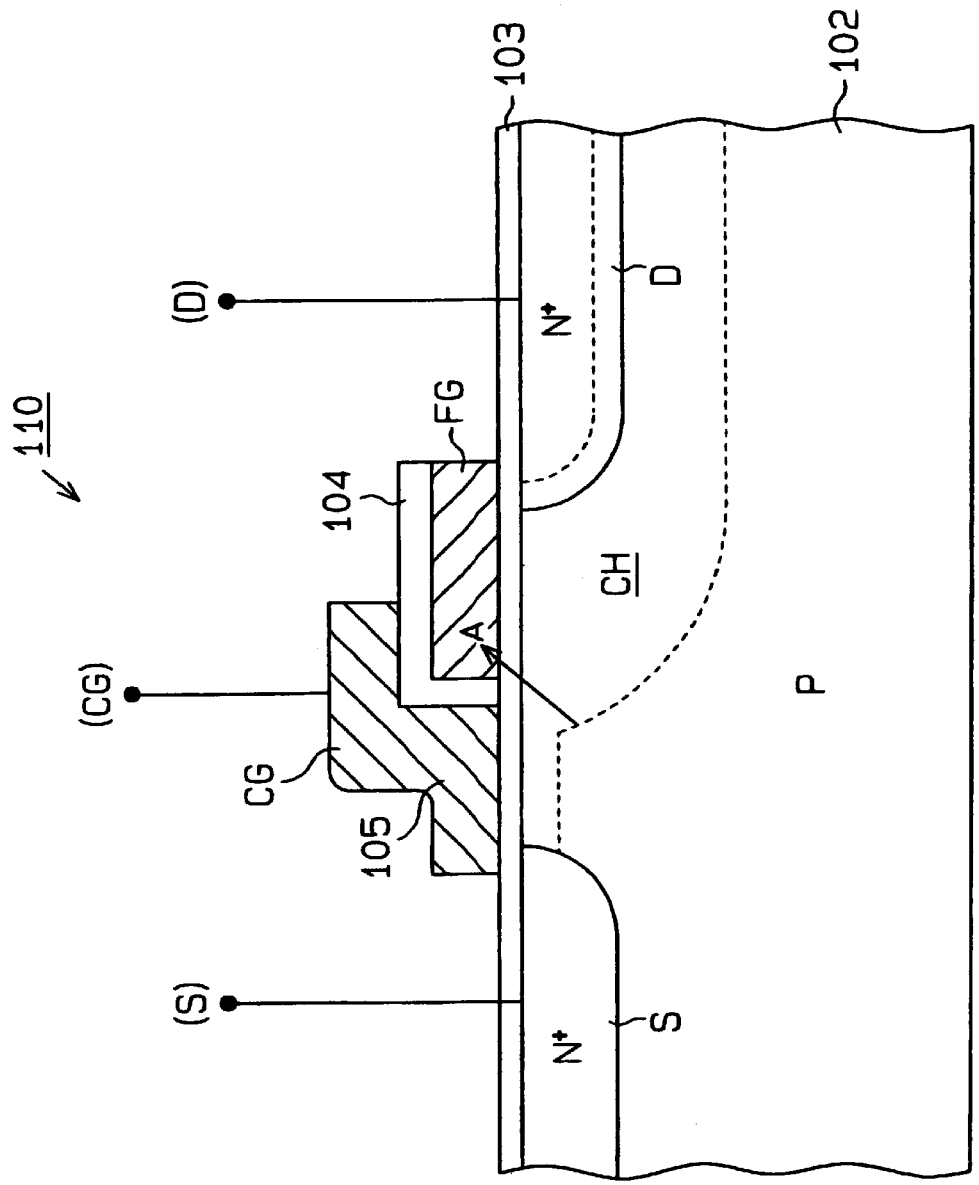
FIG. 4 is a schematic cross-sectional view of another type of split gate memory cell.
Figure 5:
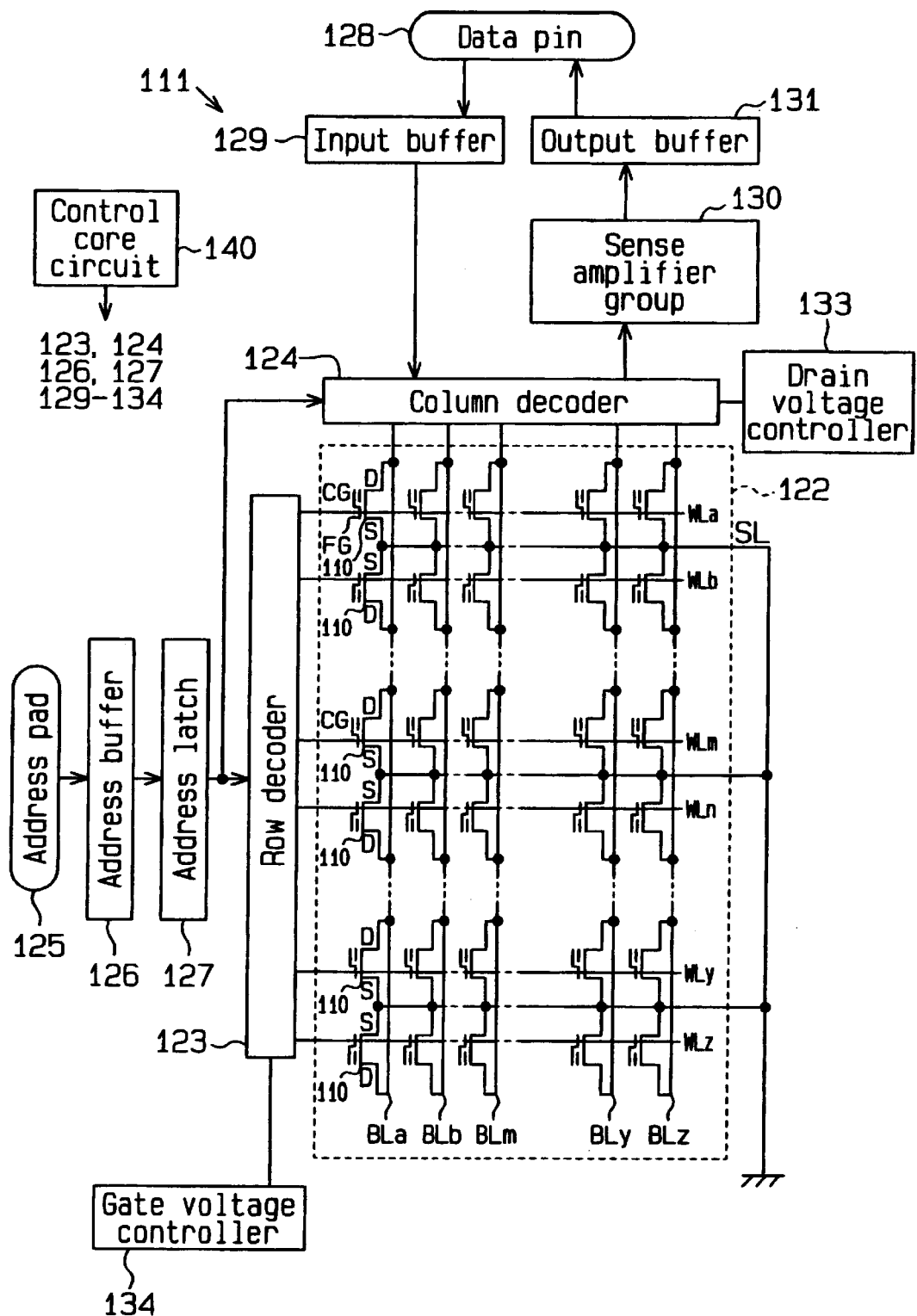
FIG. 5 is a block diagram illustrating another conventional split gate flash EEPROM.
Figure 7:
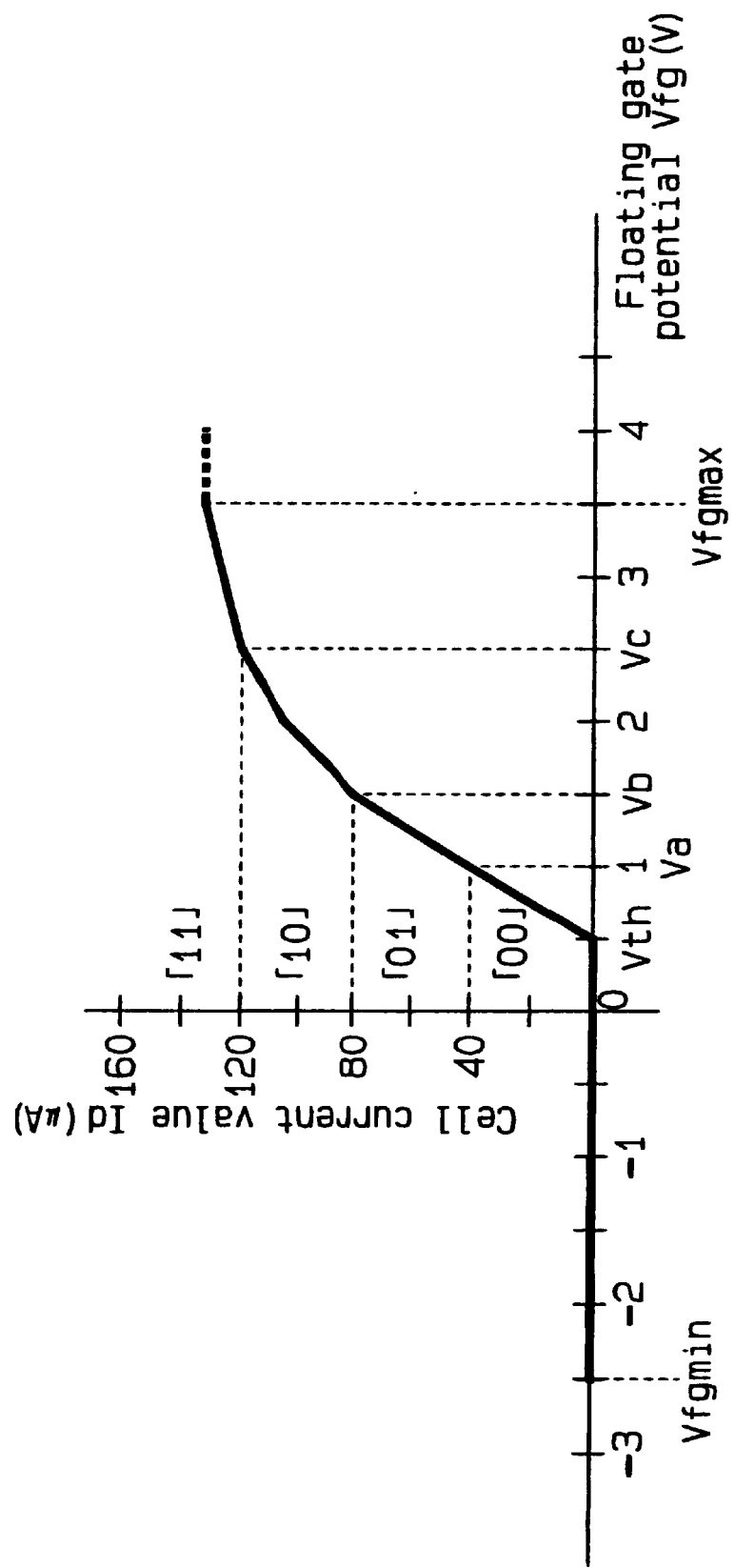
FIG. 7 is a characteristic graph showing the relationship between the cell current value and the floating gate potential of a split gate memory cell.
Figure 8:
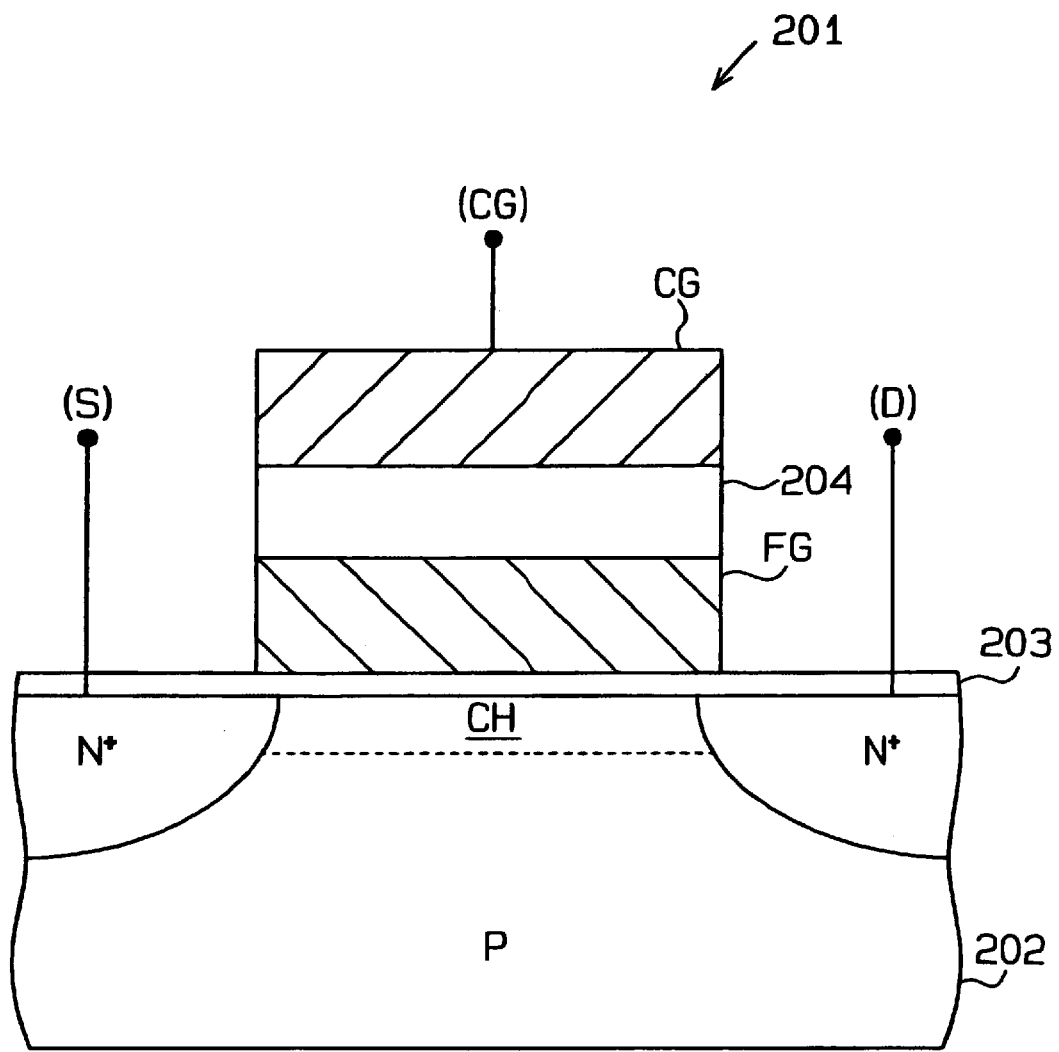
FIG. 8 is a schematic cross-sectional view of a stacked gate memory cell.
Figure 9:
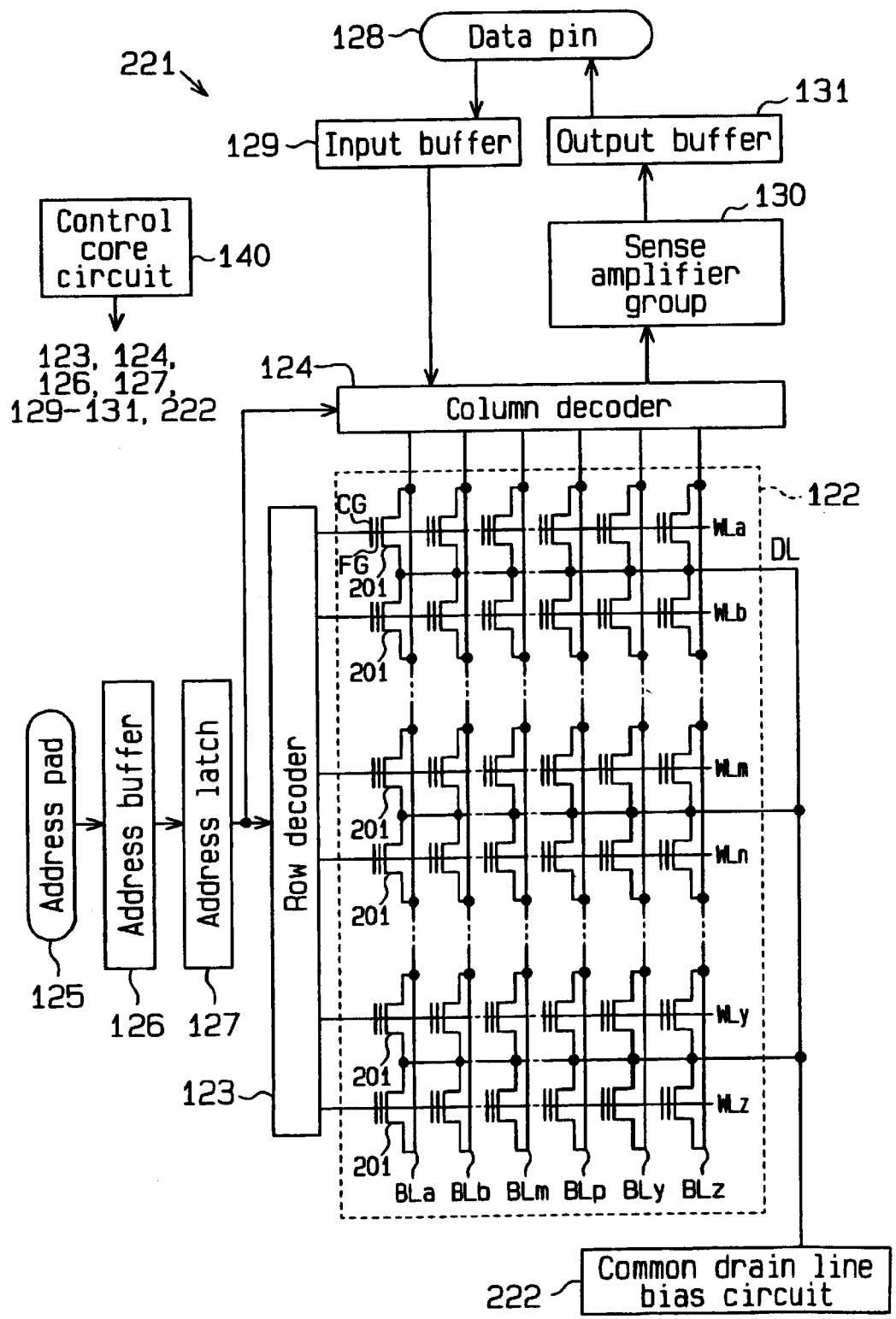
FIG. 9 is a block diagram illustrating a conventional stacked gate flash EEPROM.
Figure 11:
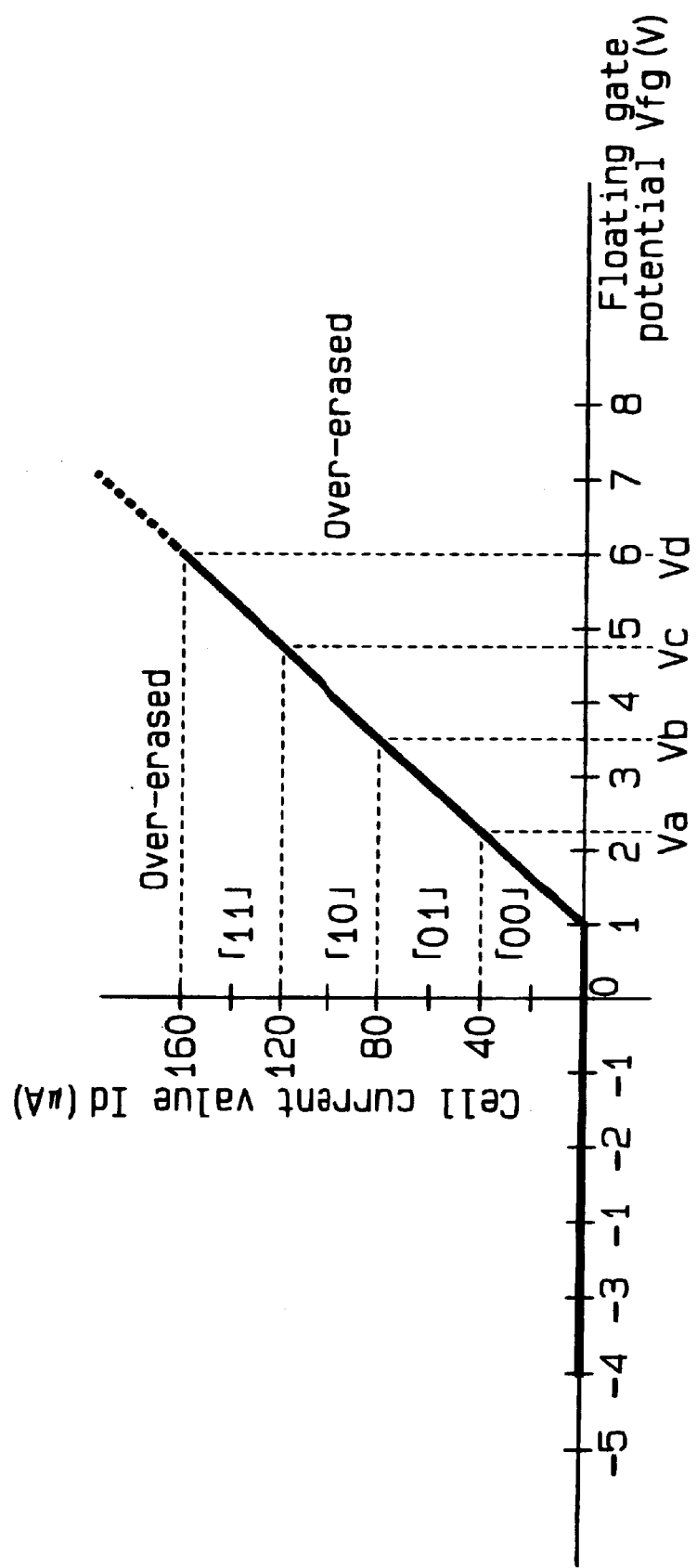
FIG. 11 is a characteristic graph showing the relationship between the current value and the floating gate potential of a stacked gate memory cell.
Figure 12:
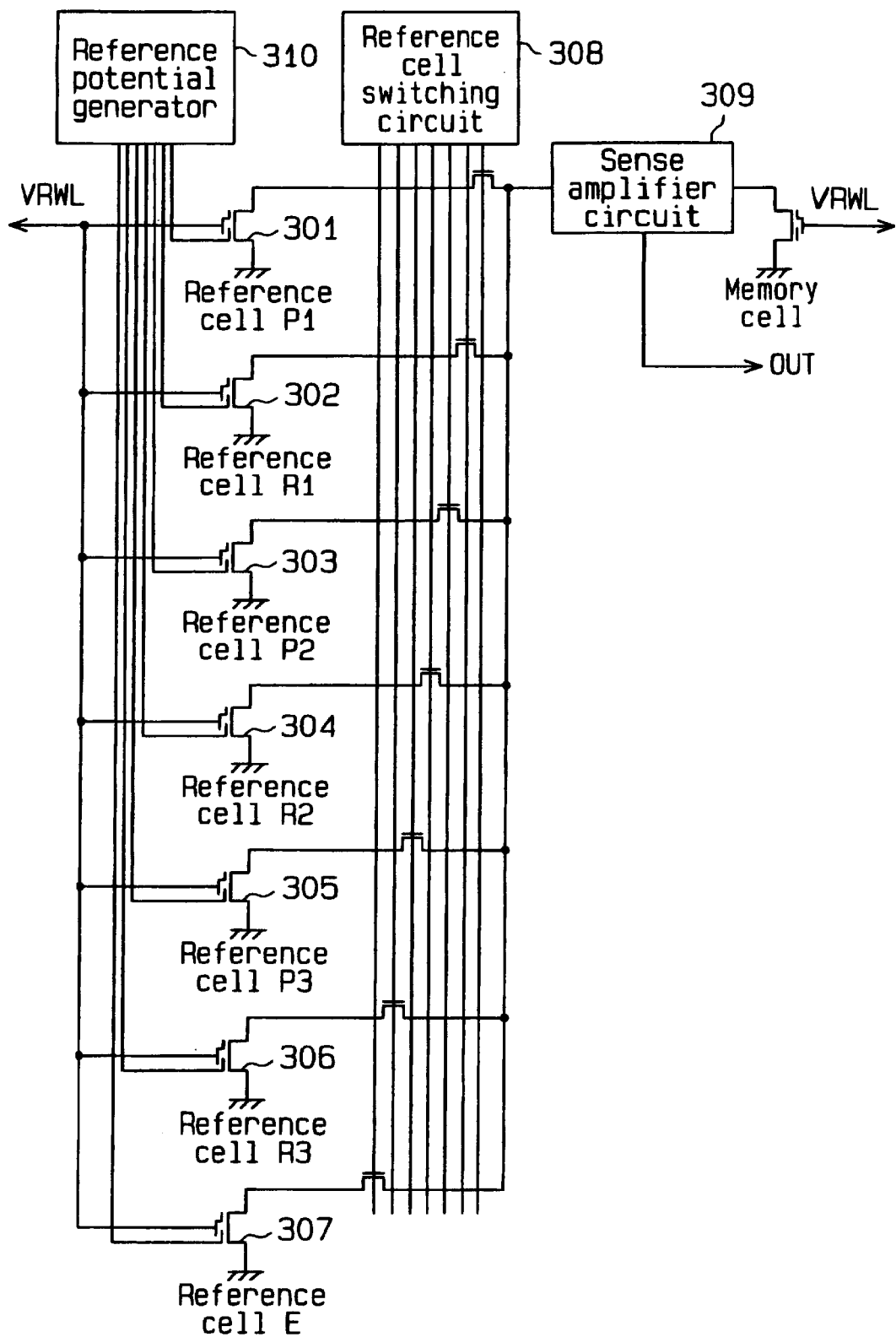
FIG. 12 is a circuit diagram of a circuit for determining multi-value data in the prior art.

The flash EEPROM 1 according to the first embodiment has a group of multi-value data sense amplifiers 2, in place of the sense amplifier group 130 of the conventional flash EEPROM shown in FIG. 2, and an output decoder 19. The multi-value data sense amplifiers 2 discriminate multi-value data. The output decoder 19 decodes signals from the sense amplifiers 2.

Figure 15:
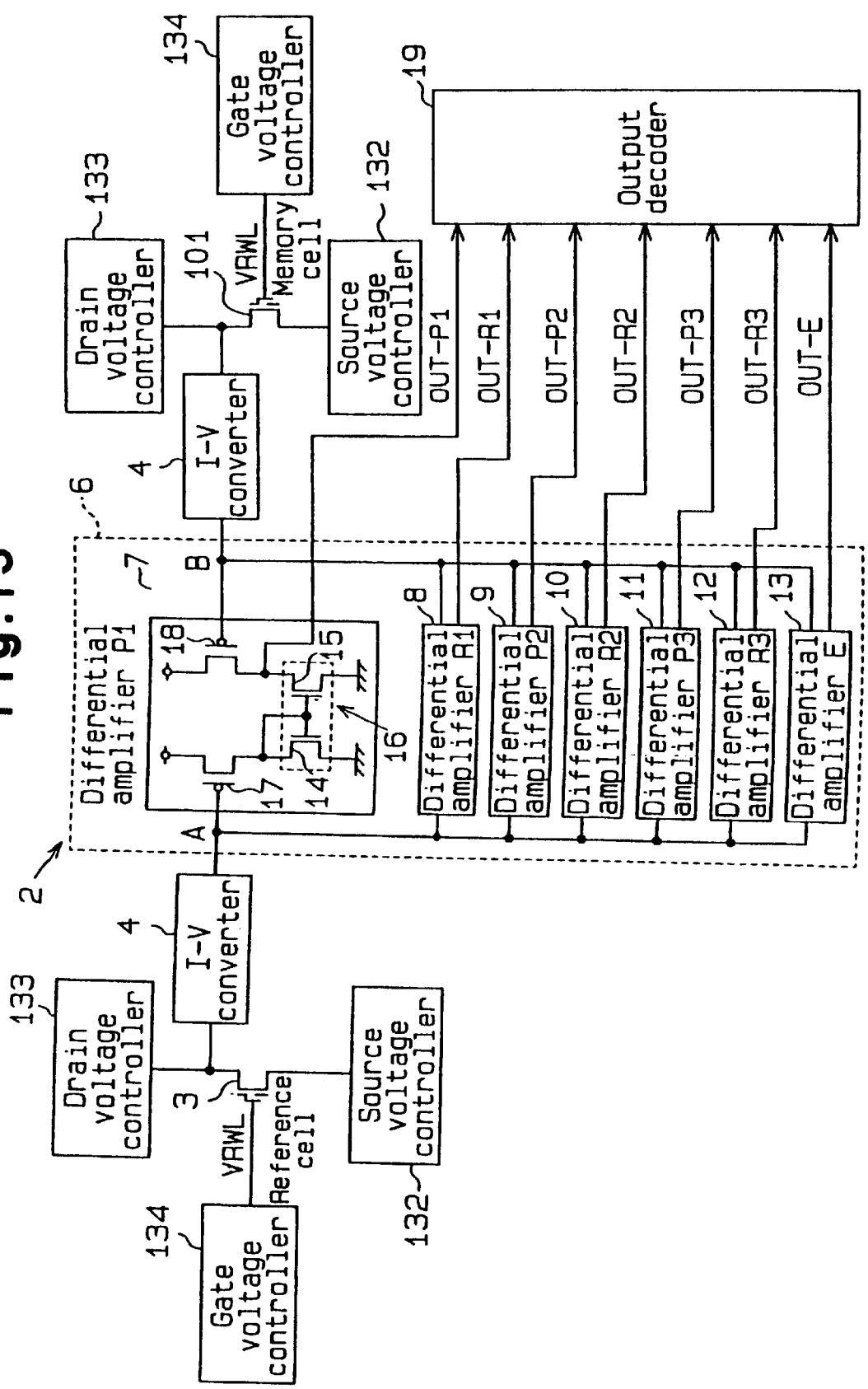
FIG. 15 is a circuit diagram showing multi-value data sense amplifiers in the flash EEPROM according to the first embodiment.
Figure 16:
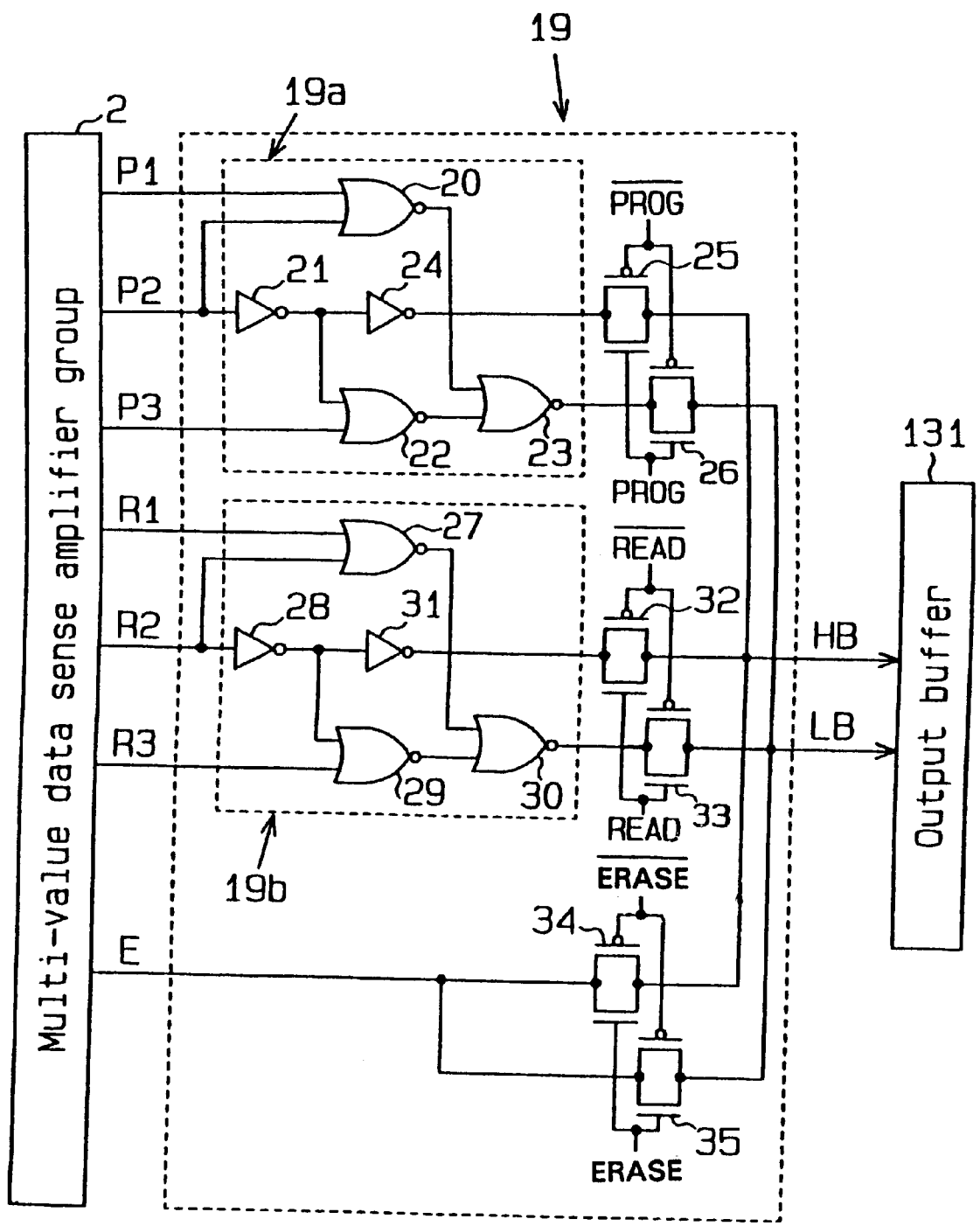
FIG. 16 is a circuit diagram depicting an output decoder in the flash EEPROM according to the first embodiment.

As shown in FIG. 15, the sense amplifier group 2 is equipped with one reference cell 3, I-V converters 4 and 5, and a comparator 6. The comparator 6 has seven differential amplifiers 7 to 13 that have determination threshold values respectively associated with seven threshold values necessary to determine 4-value data. Although FIG. 15 shows two sets of source voltage controllers 132, drain voltage controllers 133 and gate voltage controllers 134, there is actually one set of the controllers as shown in FIG. 14. The same applies to those in the sense amplifiers shown in FIGS. 18, 20 and 22.

The reference cell 3 is formed in the vicinity of a memory cell array 122 in the same step as memory cells 101. The reference cell 3 therefore has the same size and same shape as the memory cells 101. The reference cell 3 has a source S connected to the source voltage controller 132, a drain D connected to the drain voltage controller 133 and a gate G connected to the gate voltage controller 134.

The comparator 6 has a first input terminal connected to the drain D of the reference cell 3 via the I-V converter 4 and a second input terminal connected to the drains D of the memory cells 101 via the I-V converter 5. The I-V converters 4 and 5 are identical circuits using transistors of the same size and are formed in the same step.

The seven differential amplifiers 7–13 in the comparator 6 are connected in parallel between the memory cells 101 and the reference cell 3. That is, the differential amplifiers 7–13 are connected in parallel as viewed from the memory cells 101 or the reference cell 3. Each differential amplifier comprises a current mirror circuit 16 consisting of two N channel MOS transistors 14 and 15, and two P channel MOS transistors 17 and 18 respectively connected to the two input terminals of the current mirror circuit 16.

The gate voltage controller 134 applies the same voltage (VRWL) to the gates of the reference cell 3 and the memory cells 101 at the time of reading data. The source voltage controller 132 holds the voltage of each source S at the ground potential (0 V). The drain voltage controller 133 holds the voltage of each drain D at a voltage sufficient to permit the flow of the cell current (which is equal to or greater than the threshold voltage of the memory cells).

The PMOS transistor 17 has a gate for receiving a voltage signal A from the I-V converter 4. The PMOS transistor 18 has a gate for receiving a voltage signal B from the I-V converter 5. The PMOS transistors 17 and 18 output a signal of a high (H) level or a low (L) level in accordance with the potential difference between the two drains. This output signal is input to the output decoder 19. In other words, each of the differential amplifiers 7–13 drives the PMOS transistor 17 using the voltage signal, which is converted from the current flowing in the reference cell 3, and performs a determining operation based on the drain potential.

The PMOS transistors 17 in the differential amplifiers 7–13 have different sizes in the gate length and gate width. The individual PMOS transistors 17 are given such different sizes so that the differential amplifiers 7–13 have different determination threshold voltages. Specifically, the differential amplifier 7 has a determination threshold voltage corresponding to a threshold value P1 for verify read determination in write mode. When the voltage of the signal produced based on the current, which flows in a memory cell 101 (the drain potential of the PMOS transistor 18), is greater than the determination threshold voltage corresponding to the threshold value P1, the differential amplifier 7 outputs an H-level signal. The determination threshold voltage is produced based on the value of the current flowing in the reference cell 3 and is equivalent to the drain potential of the PMOS transistor 17. That is, when the cell current flowing in the memory cell 101 is greater than the threshold value P1, an H-level signal is output.

Likewise, the differential amplifier 8 has a determination threshold voltage corresponding to a threshold value R1 for read determination. The differential amplifier 9 has a determination threshold voltage corresponding to a threshold value P2 for verify read determination in write mode. The differential amplifier 10 has a determination threshold voltage corresponding to a threshold value R2 for read determination. The differential amplifier 11 has a determination threshold voltage corresponding to a threshold value P3 for verify read determination in write mode. The differential amplifier 12 has a determination threshold voltage corresponding to a threshold value R3 for read determination. The differential amplifier 13 has a determination threshold voltage corresponding to a threshold value E for verify read determination in erase mode. The individual differential amplifiers 8–13 output H-level signals when the voltage of the signal, which has been produced based on the value of the current flowing in the memory cell 101, exceeds the associated determination threshold voltages. The output signals of the differential amplifiers 7–13 are simultaneously input to the output decoder 19.

The output decoder 19 discriminates multi-value data based on the statuses of the signals from the differential amplifiers 7–13. FIG. 16 is a circuit diagram of the output decoder 19. Referring to FIG. 16, the outputs of the differential amplifiers 7–13 are represented by outputs P1–P3, R1–R3 and E. The outputs P1–P3, R1–R3 and E are a result of discrimination based on the threshold values P1–P3, R1–R3 and E. Specifically, the "output P1" is the output of the differential amplifier 7 for verify read determination in write mode. The "output P2" is the output of the differential amplifier 9 for verify read determination in write mode. The "output P3" is the output of the differential amplifier 11 for verify read determination in write mode. The "output R1" is the output of the differential amplifier 8 for read determination. The "output R2" is the output of the differential amplifier 10 for read determination. The "output R3" is the output of the differential amplifier 12 for read determination. The "output E" is the output of the differential amplifier 13 for verify read determination in erase mode.

The output decoder 19 includes six NOR gates 20, 22, 23, 27, 29 and 30, four inverters 21, 24, 28 and 31, and six transfer gates 25, 26, 32, 33, 34 and 35. The NOR gates 20, 22 and 23 and the inverters 21 and 24 form a logic circuit group 19a. The NOR gates 27, 29 and 30 and the inverters 28 and 31 form a logic circuit group 19b.

The NOR gate 20 receives the outputs P1 and P2. The transfer gate 25 receives the output P2 via the two inverters 21 and 24. The NOR gate 22 receives the inverted output P2 via the inverter 21, and the output P3. The NOR gate 23 receives the outputs of the NOR gates 20 and 22 and supplies its output signal to the transfer gate 26. The transfer gates 25 and 26 receive the outputs of the logic circuit group 19a in this manner.

When the transfer gates 25 and 26 are selected by the control core circuit 140, the transfer gate 25 supplies an output, which represents the upper bit HB of four-value data, to the output buffer 131 in accordance with the output of the inverter 24. The transfer gate 26 supplies an output, which represents the lower bit LB of the four-value data, to the output buffer 131 in accordance with the output of the NOR gate 23.

Figure 13:
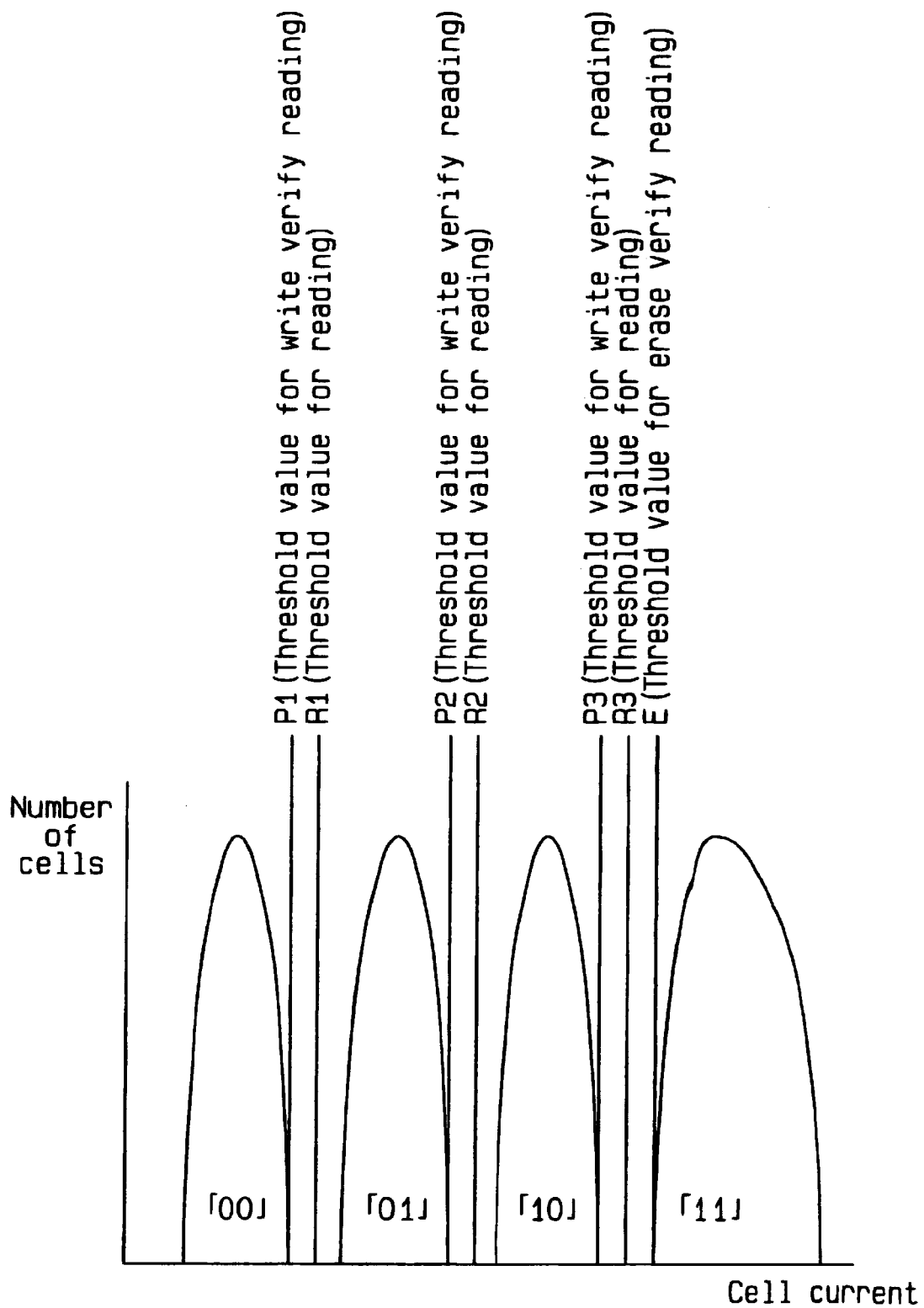
FIG. 13 is a diagram of the distribution of the cell current of a memory cell designed for 4-value data.

The following Table 1 shows the relationship among the individual data values defined in FIG. 13 and the outputs HB and LB of the transfer gates 25 and 26.

TABLE 1

| P1 | P2 | P3 | HB | LB | Data Value |
|----|----|----|----|----|------------|
| H  | H  | H  | H  | H  | 11         |
| H  | H  | L  | H  | L  | 10         |
| H  | L  | L  | L  | H  | 01         |
| L  | L  | L  | L  | L  | 00         |

The NOR gate 27 receives the outputs R1 and R2. The NOR gate 29 receives the inverted output R2 via the inverter 28, and the output R3. The transfer gate 32 receives the output R2 via the two inverters 28 and 31. The NOR gate 30 receives the outputs of the NOR gates 27 and 29 and supplies its output signal to the transfer gate 33. The transfer gates 32 and 33 receive the outputs of the logic circuit group 19b in this manner.

When the transfer gates 32 and 33 are selected by the control core circuit 140, the transfer gate 32 supplies an output, which represents the upper bit HB of four-value data, to the output buffer 131 in accordance with the output of the inverter 31. The transfer gate 33 supplies an output, which represents the lower bit LB of the four-value data, to the output buffer 131 in accordance with the output of the NOR gate 30.

Table 2 below shows the relationship among the individual data values defined in FIG. 13 and the outputs HB and LB of the transfer gates 32 and 33.

TABLE 2

| R1 | R2 | R3 | HB | LB | Data Value |
|----|----|----|----|----|------------|
| H  | H  | H  | H  | H  | 11         |
| H  | H  | H  | H  | H  | 11         |
| H  | H  | L  | H  | L  | 10         |
| H  | L  | L  | L  | H  | 01         |
| L  | L  | L  | L  | L  | 00         |

The transfer gates 34 and 35 receive the output E. When the transfer gates 34 and 35 are selected by the control core circuit 140, the transfer gates 34 and 35 supply outputs, which represent the upper bit HB and lower bit LB of four-value data, to the output buffer 131 in accordance with the output of the differential amplifier 13.

Table 3 below shows the relationship among the individual data values defined in FIG. 13 and the outputs HB and LB of the transfer gates 34 and 35.

TABLE 3

| E | HB | LB | Erased Status |
|---|----|----|---------------|
| H | H  | H  | Erased (11)   |
| L | L  | L  | Unerased (00) |

According to the first embodiment as described above, four-value data in data read mode can be determined at a time using the single reference cell 3, which has the same shape as the memory cells 101. A fast and accurate reading operation is therefore executed without being affected by a process variation at the time of fabrication. The above-described first embodiment may be adapted to the prior art memory cells 110 and 201.

Second Embodiment

Figure 17:
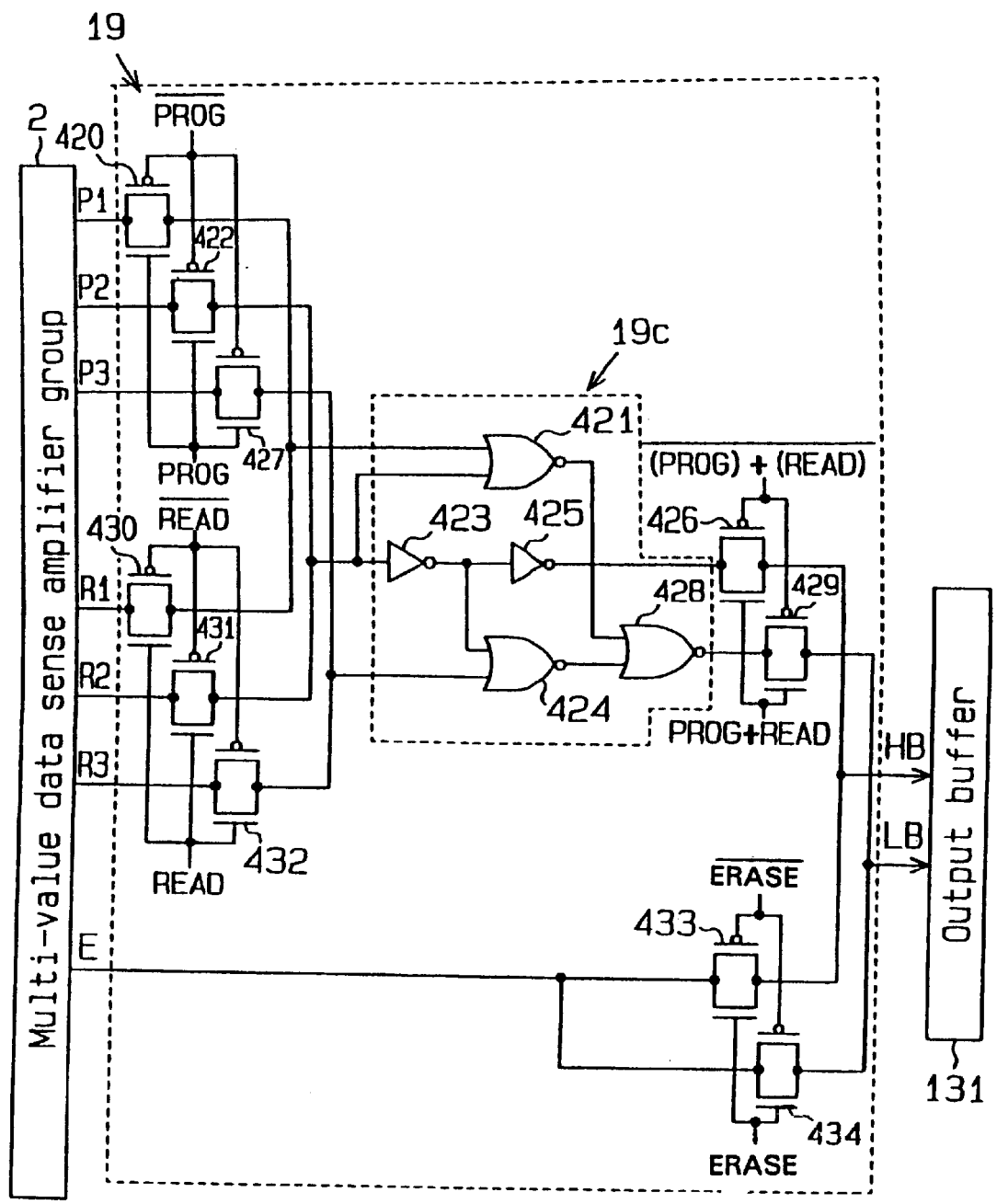
FIG. 17 is a circuit diagram illustrating an output decoder in a flash EEPROM according to a second embodiment of this invention.

The second embodiment of the invention will now be described with reference to FIG. 17. The flash EEPROM 1 according to the second embodiment differs from the first embodiment only in the structure of the output decoder 19. As shown in FIG. 17, the output decoder 19 according to the second embodiment comprises ten transfer gates 420, 422, 426, 427, and 429 to 434, three NOR gates 421, 424 and 428 and two inverters 423 and 425. The three NOR gates 421, 424 and 428 and the two inverters 423 and 425 form a logic circuit group 19c.

The NOR gate 421 receives the output P1 via the transfer gate 420 and receives the output P2 via the transfer gate 422. The NOR gate 424 receives the output P2 via the transfer gate 422 and the inverter 423 and receives the output P3 via the transfer gate 427. The transfer gate 426 receives the output P2 via the transfer gate 422 and the two inverters 423 and 425. The NOR gate 428 receives the outputs of the NOR gates 421 and 424 and sends its output signal to the transfer gate 429. The transfer gates 426 and 429 receive the outputs of the logic circuit group 19c in this manner.

The NOR gate 421 receives the output R1 via the transfer gate 420 and receives the output R2 via the transfer gate 431. The NOR gate 424 receives the output R2 via the transfer gate 431 and the inverter 423 and receives the output R3 via the transfer gate 432. The transfer gate 426 receives the output R2 via the transfer gate 431 and the two inverters 423 and 425.

The logic circuit group 19c is shared both in data determination in the verify read operation in write mode and in data determination in the normal read operation. The control core circuit 140 selects the transfer gates 420, 422 and 427 in the verify read operation in write mode and selects the transfer gates 430, 431 and 432 in the normal read operation.

When the transfer gates 420, 422, 427, 426 and 429 (or the transfer gates 430, 431, 432, 426 and 429) are selected by the control core circuit 140, the transfer gate 426 supplies an output, which represents the upper bit HB of four-value data, to the output buffer 131 in accordance with the output of the inverter 425. The transfer gate 429 supplies an output, which represents the lower bit LB of the four-value data, to the output buffer 131 in accordance with the output of the NOR gate 428.

Table 4 below shows the relationship among the individual data values defined in FIG. 13 and the outputs HB and LB of the transfer gates 426 and 429.

TABLE 4

| P1/R1 | | P2/R2 | P3/R3 | HB | LB | Data Value |
|---|---|---|---|---|---|---|
| H | H | H | H | H | | 11 |
| H | H | L | H | L | | 10 |
| H | L | L | L | H | | 01 |
| L | L | L | L | L | | 00 |

The transfer gates 433 and 434 receive the output E. When the transfer gates 433 and 434 are selected by the control core circuit 140, the transfer gates 433 and 434 supply outputs, which represent the upper bit HB and lower bit LB of four-value data, to the output buffer 131 in accordance with the output of the differential amplifier 13. The relationship among the individual data values defined in FIG. 13 and the outputs HB and LB of the transfer gates 433 and 434 is the same as the relationship given in Table 3 of the first embodiment.

Third Embodiment

The third embodiment of the present invention will now be described referring to FIG. 18. To avoid the redundancy, like or same reference numerals are given to those components that are the same as the corresponding components of the first and second embodiments. The flash EEPROM 1 according to the third embodiment has a multi-value data sense amplifier group 50 with a design different from those of the first and second embodiments.

The flash EEPROMs 1 of the first and second embodiments are configured such that all the differential amplifiers 7–13 are driven in any of the normal read operation, the verify read operation in write mode and the verify read operation in erase mode. The flash EEPROM 1 of the third embodiment is configured such that a first group of the differential amplifiers 8, 10 and 12 for data reading, a second group of the differential amplifiers 7, 9 and 11 for verify reading in write mode, and the differential amplifier 13 for verify reading in erase mode are selectively driven. That is, transfer gates are respectively provided for the two differential amplifier groups and the differential amplifier 13. The transfer gates select one of the differential amplifier groups and the differential amplifier 13 in response to a signal from the control core circuit 140. This selective driving of the differential amplifiers prohibits the driving of the unnecessary differential amplifiers, thus reducing the current consumption.

Figure 18:
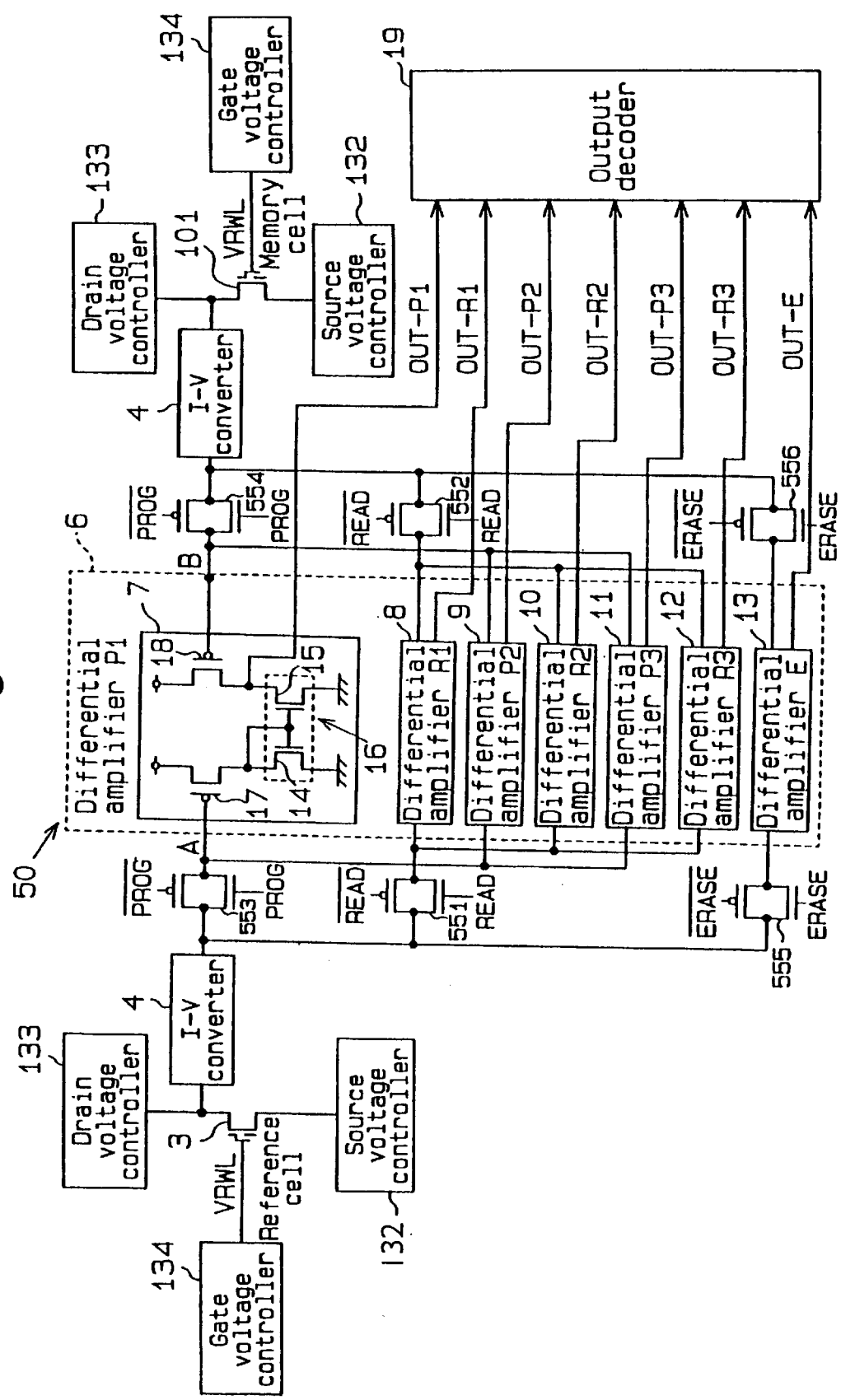
FIG. 18 is a circuit diagram showing multi-value data sense amplifiers in a flash EEPROM according to a third embodiment of this invention.

FIG. 18 is a circuit diagram showing the multi-value data sense amplifier group 50 in the third embodiment. The sense amplifier group 50 includes a comparator 6 and three pairs of transfer gates 551 and 552, 553 and 554, and 555 and 556. The first pair of transfer gates 551 and 552 are arranged between the group of differential amplifiers 8, 10 and 12 for data reading, and the I-V converters 4 and 5 respectively. The second pair of transfer gates 553 and 554 are arranged between the group of differential amplifiers 7, 9 and 11 for verify reading in write mode, and the I-V converters 4 and 5 respectively. The last pair of transfer gates 555 and 556 are arranged between the differential amplifier 13 for verify reading in erase mode, and the I-V converters 4 and 5 respectively.

In the normal reading operation, the control core circuit 140 selectively controls the individual transfer gates such that only the transfer gates 551 and 552 are enabled. In the verify read operation in write mode, the control core circuit 140 selectively controls the individual transfer gates such that only the transfer gates 553 and 554 are enabled. In the verify read operation in erase mode, the control core circuit 140 selectively controls the individual transfer gates such that only the transfer gates 555 and 556 are enabled. This structure permits only the necessary differential amplifier or amplifiers to be driven, thus reducing the current consumption.

The invention is not limited to the above-described first to third embodiments, and similar advantages can be obtained if the invention is embodied in the following forms.

1) In the individual embodiments, the determination threshold values of the differential amplifiers 7–13 may be provided by changing the number of the individual PMOS transistors 17 instead of altering the sizes of the PMOS transistors 17. For instance, the differential amplifier 10 has parallel-connected PMOS transistors quantity of which is 1.5 times the number of the PMOS transistors 17 in the differential amplifier 8. If two PMOS transistors 17 are used in the differential amplifier 8, the number of the PMOS transistors 17 used in the differential amplifier 10 becomes three.

2) In the individual embodiments, the output decoder 19 discriminates a data value and sends outputs of the upper bit and lower bit of 4-value data to the output buffer 131. Instead of this discrimination, the control core circuit 140 may receive the comparison result from the comparator 6 and discriminate a data value.

Fourth Embodiment

Figure 19:
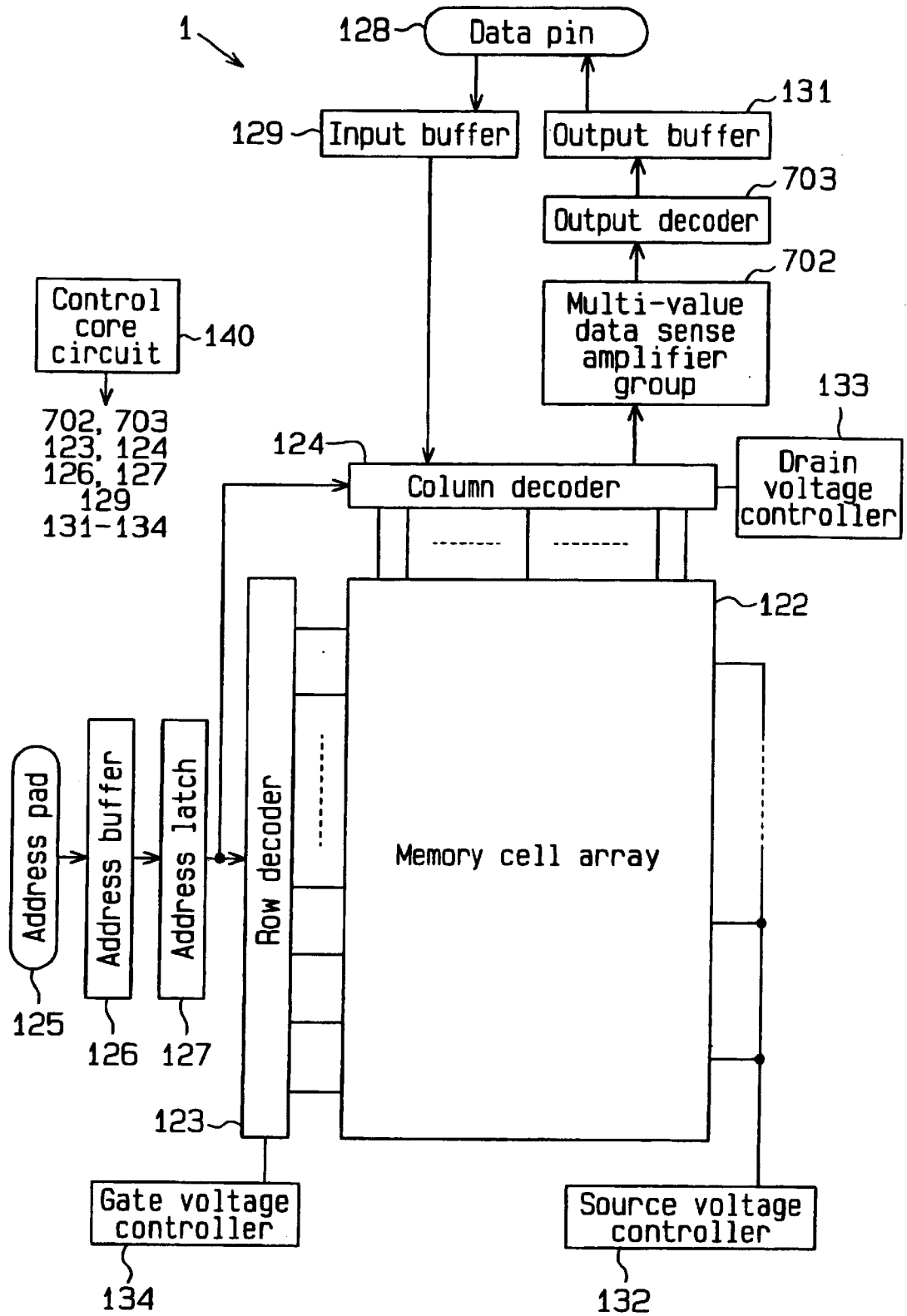
FIG. 19 is a block circuit diagram illustrating a flash EEPROM according to a fourth embodiment of the invention.

The fourth embodiment of the present invention will now be described with reference to FIGS. 19 through 21. To avoid the redundancy, like or same reference numerals are given to those components that are the same as the corresponding components of the first to third embodiments. FIG. 19 is a circuit block diagram illustrating a split gate flash EEPROM 1, which is adapted for writing and reading of 4-value data. The flash EEPROM according to the fourth embodiment has a multi-value data sense amplifier group 702 and an output decoder 703, which have different structures from the structures of those in the first to third embodiments.

Figure 20:
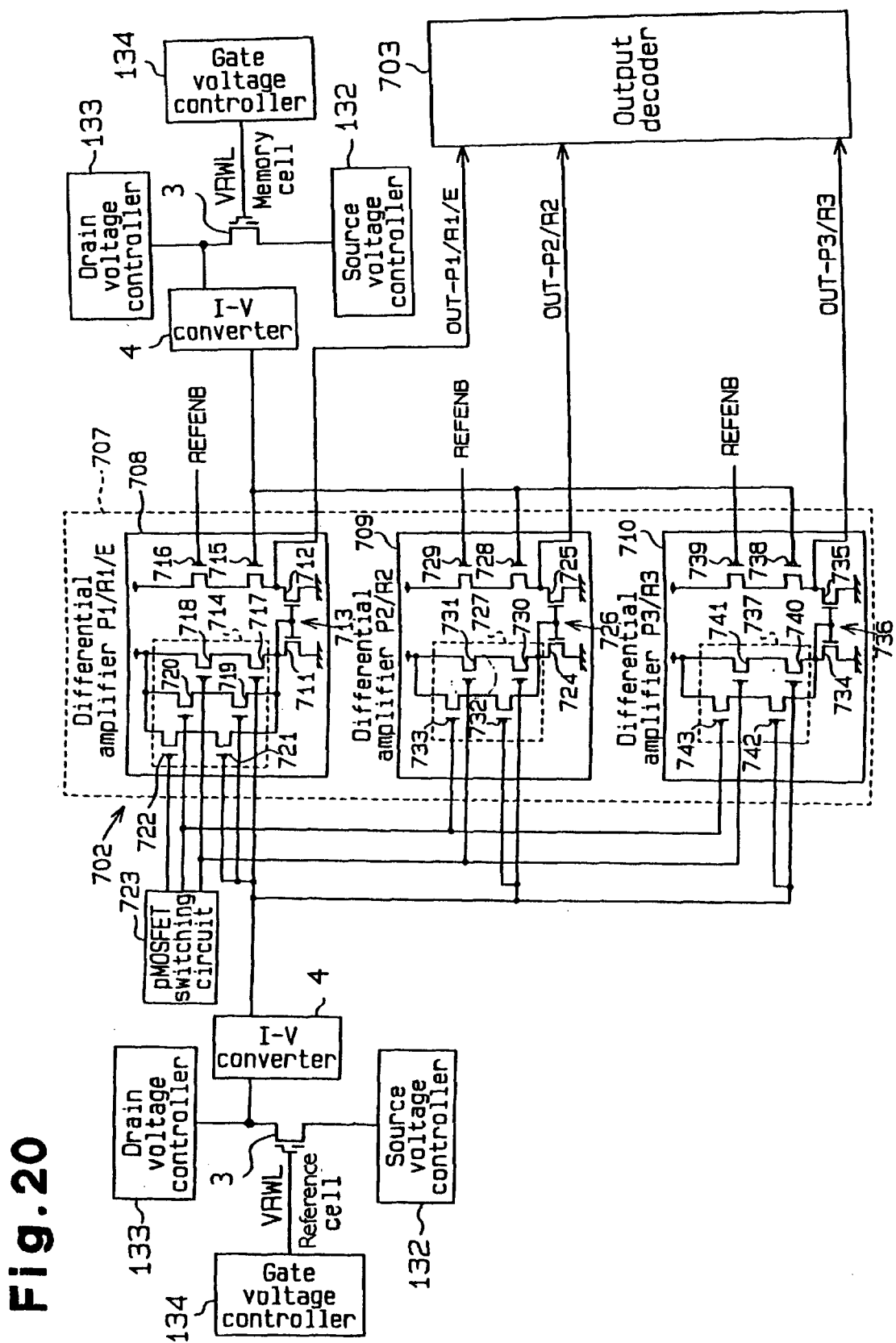
FIG. 20 is a circuit diagram showing multi-value data sense amplifiers in the flash EEPROM according to the fourth embodiment.
Figure 21:
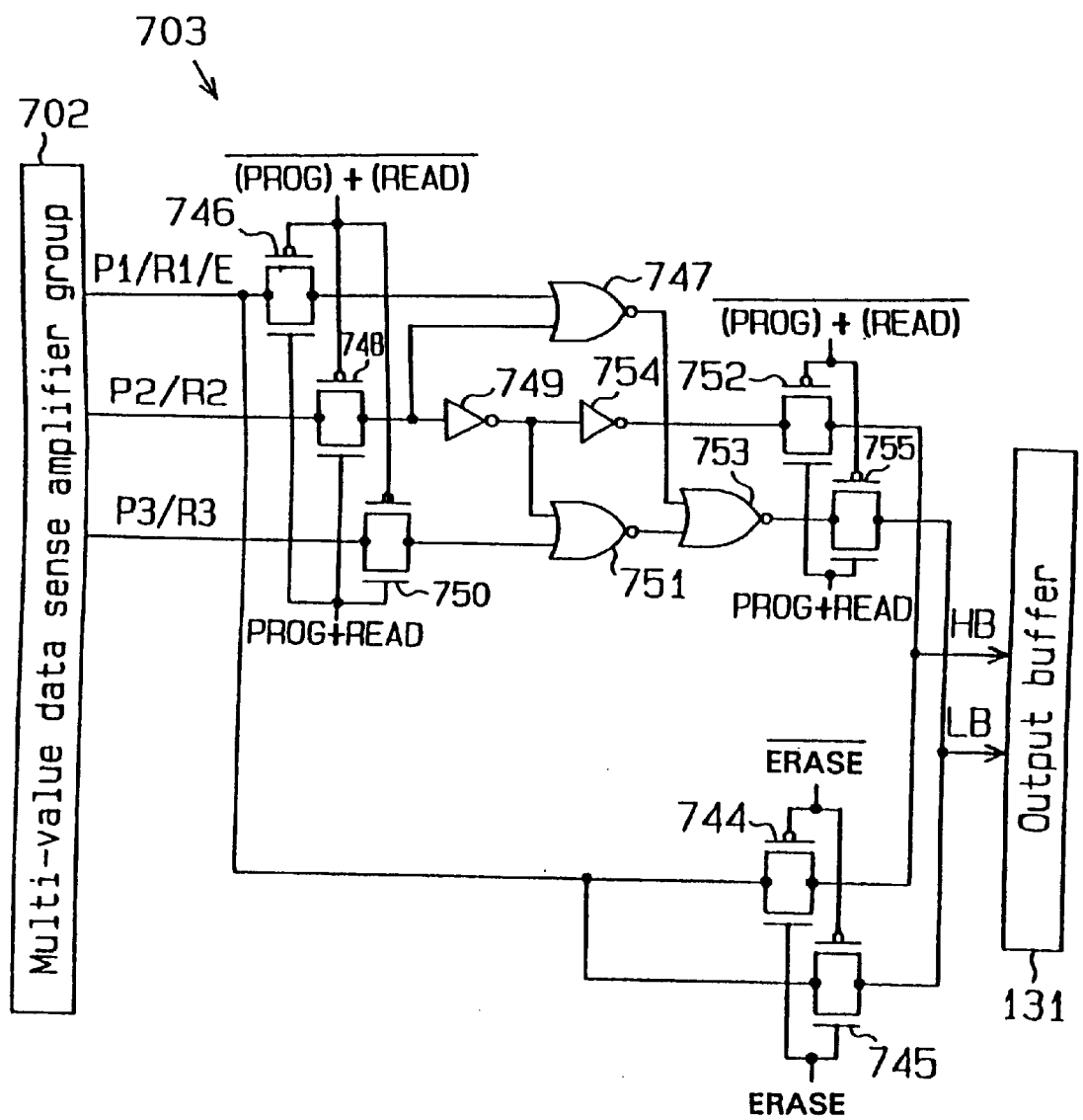
FIG. 21 is a circuit diagram depicting an output decoder in the flash EEPROM according to the fourth embodiment.

As shown in FIG. 20, the sense amplifier group 702 includes one reference cell 3, I-V converters 4 and 5, a comparator 707 and a PMOSFET switching circuit 723. The comparator 707 has three differential amplifiers 708, 709 and 710, which have determination threshold values respectively corresponding to seven threshold values needed for determining four-value data. The three differential amplifiers 708, 709 and 710 are connected in parallel as viewed from the memory cells 101 or the reference cell 3. That is, the three differential amplifiers 708, 709 and 710 are connected in parallel between the reference cell 3 and the memory cells 101 via the I-V converters 4 and 5.

According to the fourth embodiment, three differential amplifiers are commonly used for the "verify read operation in write mode" and the "normal reading operation" by sharing the current mirror circuit. Further, the differential amplifier 708 is also shared for the "verify read operation in erase mode". This structure is based on the fact that the three kinds of data read modes, namely "verify read operation in write mode", "normal read operation" and "verify read operation in erase mode", are not performed simultaneously.

The differential amplifier 708 has a current mirror circuit 713 consisting of two NMOS transistors (hereinafter called NMOSFETs) 711 and 712, a first selector and threshold voltage generator 714, and two PMOS transistors (hereinafter called PMOSFETs) 715 and 716. This current mirror circuit 713 has first and second input terminals. The first selector and threshold voltage generator 714 consists of three series circuits connected in parallel between a high-potential power supply and the first input terminal of the current mirror circuit 713. The three series circuits are a series circuit of PMOSFETs 717 and 718, a series circuit of PMOSFETs 719 and 720, and a series circuit of PMOSFETs 721 and 722. The PMOSFETs 718, 720 and 722 form a selector. The PMOSFETs 717, 719 and 721 form a threshold voltage generator.

The series circuit of PMOSFETs 715 and 716 is connected between the high-potential power supply and the second input terminal of the current mirror circuit 713.

The PMOSFETs 717, 719 and 721 have gates connected to the I-V converter 5. The PMOSFET 715 has a gate connected to the I-V converter 5. The PMOSFETs 716, 718, 720 and 722 are formed in the same process so as to have the same size. The PMOSFETs 718, 720 and 722 are selectively enabled in response to a signal from the PMOSFET switching circuit 723 to thereby individually select the PMOSFET 717, 719 or 721. The PMOSFET 716 is enabled in response to a signal REFENB from the control core circuit 140 when one of the PMOSFETs 718, 720 and 722 is selected by the PMOSFET switching circuit 723.

The size (the gate length and gate width) of the PMOSFET 717 is so set as to produce a determination threshold voltage corresponding to the threshold value P1 (see FIG. 13) for verify reading in write mode. This determination threshold voltage is the voltage of the signal, which has been generated based on the value of the current flowing in the reference cell 3, and is equivalent to the drain voltage of the PMOSFET 717.

The size of the PMOSFET 719 is so set as to produce a determination threshold voltage corresponding to the threshold value R1 (see FIG. 13) for data reading. This determination threshold voltage is equivalent to the drain voltage of the PMOSFET 719.

The size of the PMOSFET 721 is so set as to produce a determination threshold voltage corresponding to the threshold value E (see FIG. 13) for verify reading in erase mode. This determination threshold voltage is equivalent to the drain voltage of the PMOSFET 721.

The differential amplifier 708 receives a voltage signal from the I-V converter 5. The amplifier 708 compares the determination threshold voltage produced by the PMOSFET 717, 719 or 721 currently selected by the PMOSFET switching circuit 723 with the voltage of the signal that has been produced based on the current flowing in the memory cell 101 of interest (the drain voltage of the PMOSFET 715). The differential amplifier 708 outputs an H-level signal when the voltage proportional to the cell current of the memory cell 101 is greater than the determination threshold voltage and outputs an L-level signal when the former voltage is smaller than the latter voltage. That is, an H-level signal is output when the value of the cell current flowing in the memory cell 101 is greater than the threshold value P1, R1 or E in FIG. 13.

The differential amplifier 709 has a current mirror circuit 726 consisting of two NMOSFETs 724 and 725, a second selector and threshold voltage generator 727, and two PMOSFETs 728 and 729. This current mirror circuit 726 has first and second input terminals. The second selector and threshold voltage generator 727 consists of a series circuit of PMOSFETs 730 and 731 and a series circuit of PMOSFETs 732 and 733, both connected in parallel between the first input terminal of the current mirror circuit 726 and the high-potential power supply. The PMOSFETs 731 and 733 form a selector. The PMOSFETs 730 and 732 form a threshold voltage generator.

The series circuit of PMOSFETs 728 and 729 is connected between the second input terminal of the current mirror circuit 726 and the high-potential power supply.

The PMOSFETs 730 and 732 have gates connected to the I-V converter 4. The PMOSFET 728 has a gate connected to the I-V converter 5. The PMOSFETs 729, 731 and 733 are formed in the same process so as to have the same size. The PMOSFETs 731 and 733 are selectively enabled in response to a signal from the PMOSFET switching circuit 723 to thereby individually select the PMOSFET 730 or 732. The PMOSFET 729 is enabled in response to the signal REFENB from the control core circuit 140 when either one of the PMOSFETs 730 and 732 is selected by the PMOSFET switching circuit 723.

The size of the PMOSFET 730 is so set as to produce a determination threshold voltage corresponding to the threshold value P2 (see FIG. 13) for verify reading in write mode. This determination threshold voltage is equivalent to the drain voltage of the PMOSFET 730.

The size of the PMOSFET 732 is so set as to produce a determination threshold voltage corresponding to the threshold value R2 (see FIG. 13) for data reading. This determination threshold voltage is equivalent to the drain voltage of the PMOSFET 732.

The differential amplifier 709 receives a voltage signal from the I-V converter 5 and compares the determination threshold voltage produced by the PMOSFET 730 or 732 currently selected by the PMOSFET switching circuit 723 with the voltage of the signal that has been produced based on the current flowing in the memory cell 101 of interest (the drain voltage of the PMOSFET 728). The differential amplifier 709 outputs an H-level signal when the voltage proportional to the cell current of the memory cell 101 is greater than the determination threshold voltage and outputs an L-level signal when the former voltage is smaller than the latter voltage.

The differential amplifier 710 has a current mirror circuit 736 consisting of two NMOSFETs 734 and 735, a third selector and threshold voltage generator 737, and two PMOSFETs 738 and 739. This current mirror circuit 736 has first and second input terminals. The third selector and threshold voltage generator 737 consists of a series circuit of PMOSFETs 740 and 741, and a series circuit of PMOSFETs 742 and 743 both connected in parallel between the first input terminal of the current mirror circuit 736 and the high-potential power supply. The PMOSFETs 741 and 743 form a selector. The PMOSFETs 740 and 742 form a threshold voltage generator.

The series circuit of PMOSFETs 738 and 739 is connected between the second input terminal of the current mirror circuit 736 and the high-potential power supply.

The PMOSFETs 740 and 742 have gates connected to the I-V converter 5. The PMOSFET 738 has a gate connected to the I-V converter 5. The PMOSFETs 739, 741 and 743 are formed in the same process so as to have the same size. The PMOSFETs 741 and 743 are selectively enabled in response to a signal from the PMOSFET switching circuit 723 to thereby individually select the PMOSFET 740 or 742. The PMOSFET 739 is enabled in response to the signal REFENB from the control core circuit 140 when either one of the PMOSFETs 740 and 742 is selected by the PMOSFET switching circuit 723.

The size of the PMOSFET 740 is set to produce a determination threshold voltage corresponding to the threshold value P3 (see FIG. 13) for verify reading in write mode. This determination threshold voltage is equivalent to the drain voltage of the PMOSFET 740.

The size of the PMOSFET 742 is set to produce a determination threshold voltage corresponding to the threshold value R3 (see FIG. 13) for data reading. This determination threshold voltage is equivalent to the drain voltage of the PMOSFET 742.

The differential amplifier 710 receives a voltage signal from the I-V converter 4 and compares the determination threshold voltage produced by the PMOSFET 740 or 742 currently selected by the PMOSFET switching circuit 723 with the voltage of the signal that has been produced based on the current flowing in the memory cell 101 of interest (the drain voltage of the PMOSFET 738). The differential amplifier 710 outputs an H-level signal when the voltage proportional to the cell current of the memory cell 101 is greater than the determination threshold voltage and outputs an L-level signal when the former voltage is smaller than the latter voltage.

The current mirror circuits 713, 726 and 736 are the identical circuits constituted of a plurality of transistors fabricated in the same step to have the same site.

At the time of reading data, the gate voltage controller 134 applies the same voltage (VRWL) to the gates of the reference cell 3 and the memory cells 101. The source voltage controller 132 holds the voltages of the sources S of the reference cell 3 and the memory cells 101 at the ground potential (0 V). The drain voltage controller 133 holds the voltages of the drains D of the reference cell 3 and the memory cells 101 at a voltage sufficient to permit the flow of the cell current (which is equal to or greater than the threshold voltage of the memory cells).

The PMOSFET switching circuit 723 enables only the PMOSFETs 718, 731 and 741 under the control of the control core circuit 140 when the data read mode is the "verify read determining operation in write mode". When the data read mode is the "normal reading operation", the switching circuit 723 enables only the PMOSFETs 720, 733 and 743. When the data read mode is the "verify read determining operation in erase mode", only the PMOSFET 722 is enabled.

Then, the voltage signal from the I-V converter 4 is supplied to the gates of the individual PMOSFETs of the first, second and third selector and threshold voltage generators 714, 727 and 737, which are associated with the PMOSFETs selected by the switching circuit 723. The voltage signal from the I-V converter 5 is supplied to the gates of the PMOSFETs 715, 728 and 738. Consequently, the differential amplifiers 708, 709 and 710 output H-level or L-level signals in accordance with the potential difference between the first and second input terminals of the current mirror circuits 713, 726 and 736. The output signals are supplied to the output decoder 703.

In other words, of the PMOSFETs 717, 719, 721, 730, 732, 740 and 742 in the differential amplifiers 708–710, the ones that have been selected by the PMOSFET switching circuit 723 operate in response to the voltage signal converted from the current flowing in the reference cell 3. The differential amplifiers 708–710 perform comparison and determination based on the drain voltage of the selected PMOSFET.

The output decoder 703 simultaneously receives the output signals of the differential amplifiers 708–710 and discriminates multi-value data based on the statuses of the output signals. As shown in FIG. 21, the output decoder 703 includes seven transfer gates 744, 745, 746, 748, 750, 752 and 755, three NOR gates 751, 753 and 747, and two inverters 749 and 754.

The NOR gate 747 receives the output P1/R1/E from the differential amplifier 708 via the transfer gate 746 and receives the output P2/R2 from the differential amplifier 709 via the transfer gate 748. The NOR gate 751 receives the output P2/R2 via the transfer gate 748 and the inverter 749 and receives the output P3/R3 from the differential amplifier 710 via the transfer gate 750. The output of the inverter 749 is input to the transfer gate 752 via the inverter 754. The NOR gate 753 receives the outputs from the NOR gates 747 and 751 and sends its output signal to the transfer gate 755. The transfer gates 744 and 745 receive the output P1/R1/E.

When the data read mode is the "verify read determining operation in write mode", the control core circuit 140 enables the transfer gates 746, 748, 750, 752 and 755 and keeps the other transfer gates disabled. In this case, the output representing the upper bit HB of 4-value data is supplied to the output buffer 131 from the transfer gate 752. The output representing the lower bit LB of 4-value data is supplied to the output buffer 131 from the transfer gate 755. The relationship among the individual data values defined in FIG. 13 and the outputs HB and LB of the transfer gates 752 and 755 is the same as the relationship given in Table 4 of the second embodiment.

When the data read mode is the "verify read determining operation in erase mode", the control core circuit 140 enables the transfer gates 744 and 745 and keeps the other transfer gates disabled. In this case, the output representing the upper bit HB of 4-value data is supplied to the output buffer 131 from the transfer gate 744. The output representing the lower bit LB of 4-value data is supplied to the output buffer 131 from the transfer gate 745. The relationship among the individual data values defined in FIG. 13 and the outputs HB and LB of the transfer gates 745 and 744 is the same as the relationship given in Table 4 of the second embodiment.

The above-described sharing of the differential amplifiers reduces the number of required differential amplifiers, which has conventionally been equal to the number of threshold values for normal determination (seven in this case), so that the circuit scale is reduced while maintaining the fast operation speed.

In the fourth embodiment, the determination threshold voltages of the differential amplifiers 708–710 may be obtained by changing the number of PMOSFETs instead of changing the sizes of the PMOSFETs connected to the I-V converter 4. For example, in place of the PMOSFET 730, PMOSFETs, the quantity of which is 1.5 times the number of the PMOSFETs 717, may be connected in parallel. If two PMOSFETs 717 are used in the differential amplifier 708, three PMOSFETs 717 are used in place of the PMOSFET 730 in the differential amplifier 709. Even with this structure, the determination threshold value corresponding to the threshold value P2 for data reading is acquired in the differential amplifier 709. Further, the determination threshold value corresponding to the threshold value P1 for data reading is acquired in the differential amplifier 708.

Fifth Embodiment

Figure 22:
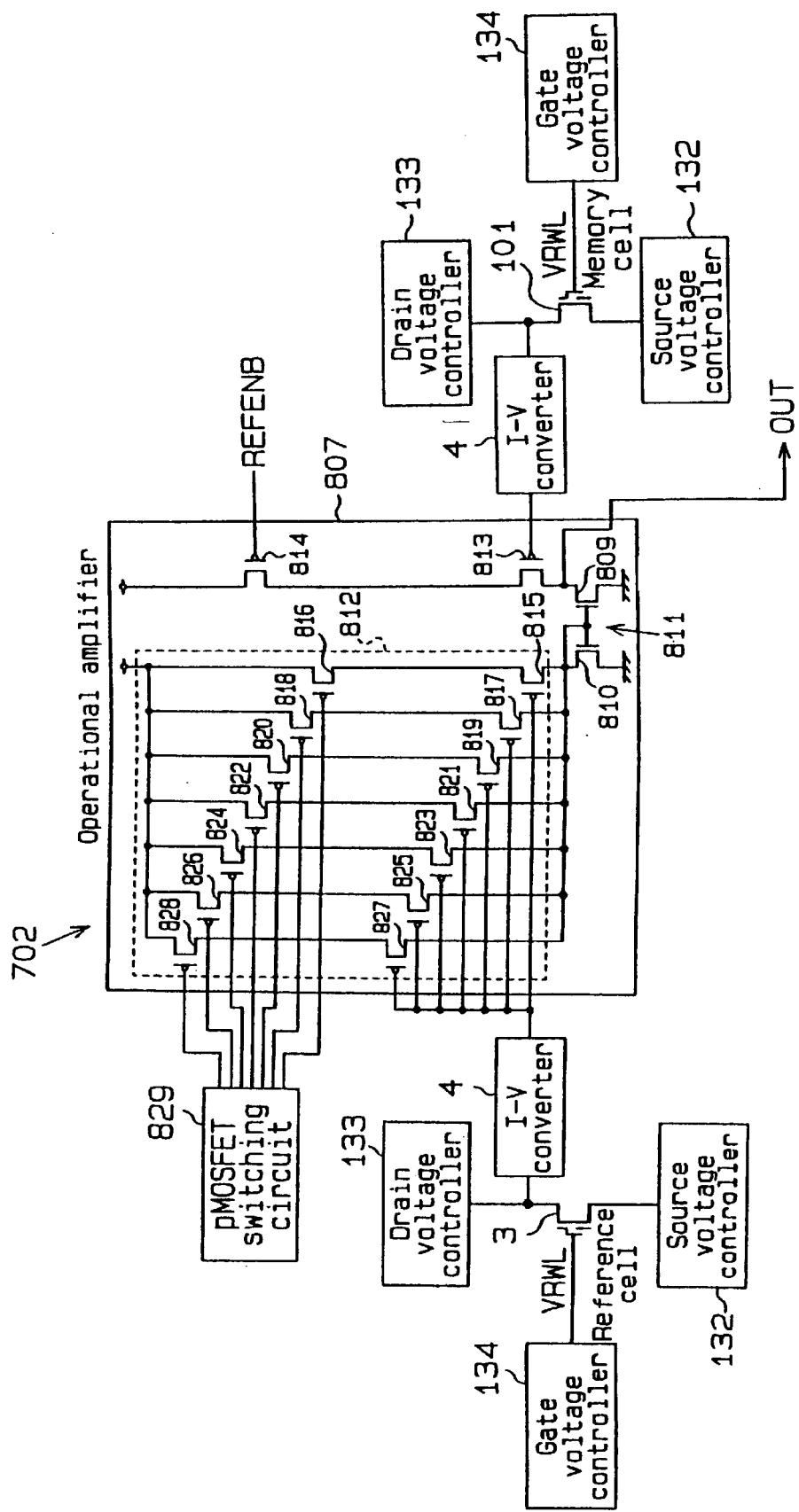
FIG. 22 is a circuit diagram showing multi-value data sense amplifiers in a flash EEPROM according to a fifth embodiment of the invention.

The fifth embodiment of the present invention will now be described with reference to FIGS. 22 and 23. To avoid a redundant description, like or same reference numerals are given to those components that are the same as the corresponding components of the first to fourth embodiments. The split gate flash EEPROM 1 according to the fifth embodiment differs from that of the fourth embodiment in the structures of the multi-value data sense amplifier group 702 and the output decoder 703. The multi-value data sense amplifier group 702 according to the fifth embodiment has a single differential amplifier 807, which includes one common current mirror circuit with respect to the determination threshold value generator in the individual operations. This structure is based on the fact that three kinds of data read modes, namely "verify read operation in write mode", "normal read operation" and "verify read operation in erase mode", are not performed simultaneously.

The differential amplifier 807 has a current mirror circuit 811 consisting of two NMOSFETs 809 and 810 of the same size, a selector and threshold voltage generator 812, and two PMOSFETs 813 and 814. This current mirror circuit 811 has first and second input terminals.

The selector and threshold voltage generator 812 consists of seven series circuits connected in parallel between the first input terminal of the current mirror circuit 811 and a high-potential power supply. The seven series circuits are a series circuit of PMOSFETs 815 and 816, a series circuit of PMOSFETs 817 and 818, a series circuit of PMOSFETs 819 and 820, a series circuit of PMOSFETs 821 and 822, a series circuit of PMOSFETs 823 and 824, a series circuit of PMOSFETs 825 and 826, and a series circuit of PMOSFETs 827 and 828. The PMOSFETs 816, 818, 820, 822, 824, 826 and 828 form a selector. The PMOSFETs 815, 817, 819, 821, 823, 825 and 827 form a threshold voltage generator.

The series circuit of PMOSFETs 813 and 814 is connected between the second input terminal of the current mirror circuit 811 and the high-potential power supply.

The PMOSFETs 815, 817, 819, 821, 823, 825 and 827 have different sizes from the one another and have gates connected to the I-V converter 5. The PMOSFET 813 has a gate connected to the I-V converter 5.

The PMOSFETs 814, 816, 818, 820, 822, 824, 826 and 828 are formed in the same process so as to have the same size. The PMOSFETs 816, 818, 820, 822, 824, 826 and 828 have gates connected to a PMOSFET switching circuit 829 and are selectively enabled in response to a signal from the switching circuit 829 to thereby individually select the PMOSFET 815, 817, 819, 821, 823, 825 or 827. The PMOSFET 814 is enabled in response to a signal REFENB from the control core circuit 140 when one of the PMOSFETs 816, 818, 820, 822, 824, 826 and 828 is selected by the PMOSFET switching circuit 829.

The size (the gate length and gate width) of the PMOSFET 815 is so set as to produce a determination threshold voltage corresponding to the threshold value P1. This determination threshold voltage is the voltage of the signal generated based on the value of the current flowing in the reference cell 3, and is equivalent to the drain voltage of the PMOSFET 815.

The size of the PMOSFET 817 is set to produce a determination threshold voltage corresponding to the threshold value P2. This determination threshold voltage is equivalent to the drain voltage of the PMOSFET 817.

The size of the PMOSFET 819 is set to produce a determination threshold voltage corresponding to the threshold value P3. This determination threshold voltage is equivalent to the drain voltage of the PMOSFET 819.

The size of the PMOSFET 821 is set to produce a determination threshold voltage corresponding to the threshold value R1. This determination threshold voltage is equivalent to the drain voltage of the PMOSFET 821.

The size of the PMOSFET 823 is set to produce a determination threshold voltage corresponding to the threshold value R2. This determination threshold voltage is equivalent to the drain voltage of the PMOSFET 823.

The size of the PMOSFET 825 is set to produce a determination threshold voltage corresponding to the threshold value R3. This determination threshold voltage is equivalent to the drain voltage of the PMOSFET 825.

The size of the PMOSFET 827 is set to produce a determination threshold voltage corresponding to the threshold value E. This determination threshold voltage is equivalent to the drain voltage of the PMOSFET 827.

One of the PMOSFETs 815, 817, 819, 821, 823, 825 and 827, which is currently selected by the PMOSFET switching circuit 829, produces a determination threshold voltage in response to the voltage signal from the I-V converter 4. The differential amplifier 807 compares that determination threshold voltage with the voltage of the signal that has been produced based on the current flowing in the memory cell 101 of interest (the drain voltage of the PMOSFET 813). The differential amplifier 807 outputs an H-level signal when the voltage proportional to the current flowing in the memory cell 101 is greater than the determination threshold voltage and outputs an L-level signal when the former voltage is smaller than the latter. That is, an H-level signal is output when the value of the cell current flowing in the memory cell 101 is greater than the threshold value P1, P2, P3, R1, R2, R3 or E.

The PMOSFET switching circuit 829 enables only the PMOSFETs 815, 817 and 819 under the control of the control core circuit 140 when the data read mode is the "verify read determining operation in write mode". When the data read mode is the "normal reading operation", the switching circuit 829 enables only the PMOSFETs 821, 823 and 825. When the data read mode is the "verify read determining operation in erase mode", the switching circuit 829 enables only the PMOSFET 827.

The control core circuit 140 controls the PMOSFET switching circuit 829 such that, in the "verify read determining operation in write mode", the PMOSFETs 815, 817 and 819 are not turned on simultaneously. In other words, the control core circuit 140 controls the switching circuit 829 such that the PMOSFETs 815,1 817 and 819 are turned on one after another with time delays. Likewise, in the "normal read determining operation", the control core circuit 140 controls the switching circuit 829 such that the PMOSFETs 821, 823 and 825 are turned on one after another with time delays.

During the data reading operation, the voltage signal from the I-V converter 4 is input to the gates of the PMOSFETs 815, 817, 819, 821, 823, 825 and 827 in the differential amplifier 807. Further, the voltage signal from the I-V converter 5 is input to the gate of the PMOSFET 813. As a result, the differential amplifier 807 outputs an H-level or L-level signal in accordance with the potential difference between the first and second input terminals of the current mirror circuit 811. At this time, the PMOSFETs are turned on one after another with time delays in the "verify read determining operation in write mode" and the "normal read determining operation". The differential amplifier 807 therefore supplies three types of output signals to the output decoder 703 one after another with time delays.

As apparent from the above, of the PMOSFETs 815, 817, 819, 821, 823, 825 and 827, the one selected by the PMOSFET switching circuit 829 operates in response to the voltage signal converted from the current that flows in the reference cell 3. The differential amplifier 807 performs comparison and determination based on the drain voltage of the selected PMOSFET.

Figure 23:
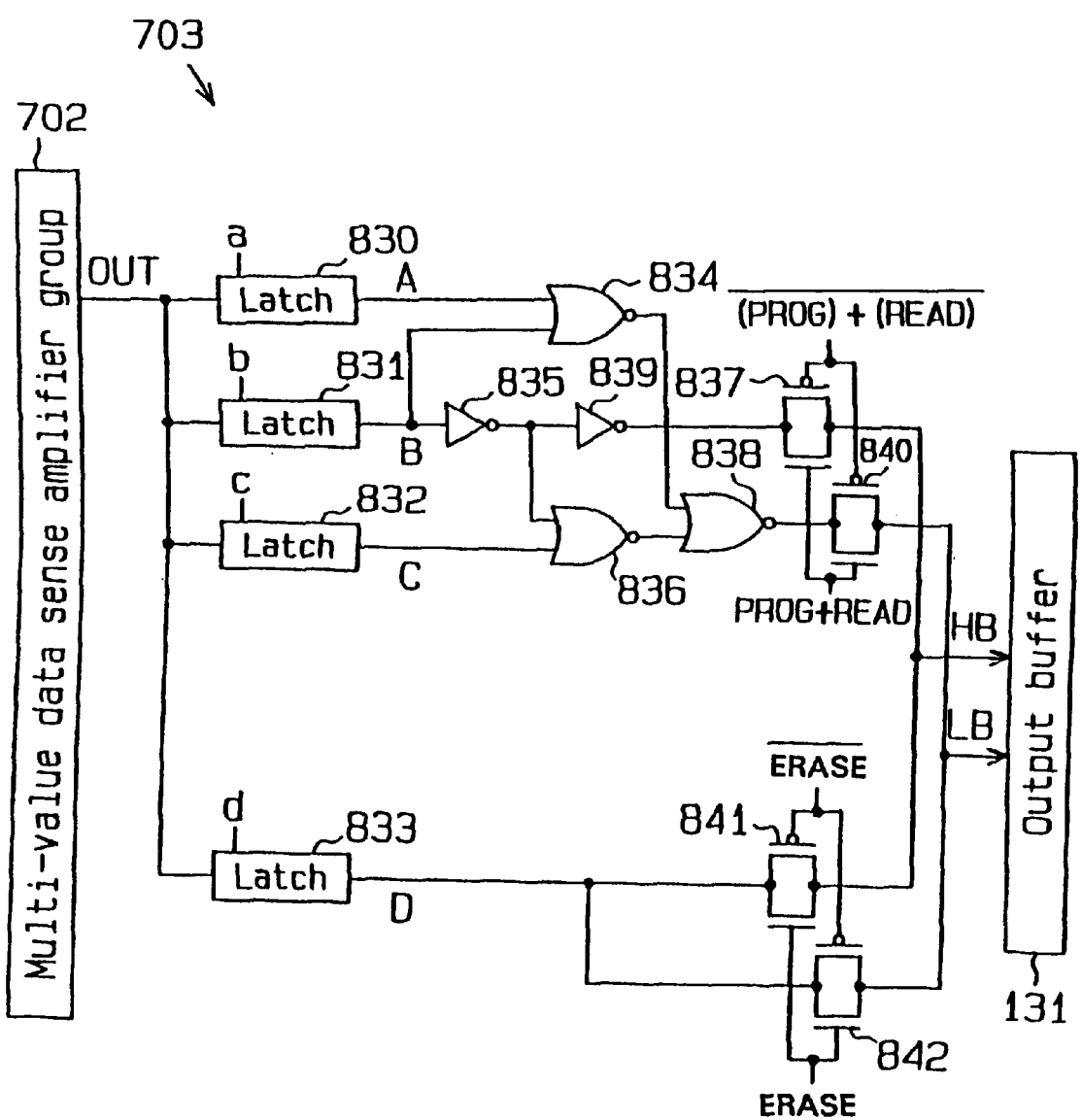
FIG. 23 is a circuit diagram depicting an output decoder in the flash EEPROM according to the fifth embodiment.

As shown in FIG. 23, the output decoder 703 includes four latch circuits 830, 831, 832 and 833, three NOR gates 834, 836 and 838, two inverters 835 and 839, and four transfer gates 837, 840, 841 and 842.

The latch circuits 830–832 respectively latch three time-shifted signals from the differential amplifier 807 in response to activate signals a, b and c from the control core circuit 140. The latch circuit 833 latches one signal from the differential amplifier 807 in response to an activate signal d from the control core circuit 140.

The NOR gate 834 receives data A, latched in the latch circuit 830, and data B, latched in the latch circuit 831. The NOR gate 836 receives the data B via the inverter 835, and data C latched in the latch circuit 832. The transfer gate 837 receives the data B via the inverters 835 and 839. The NOR gate 838 receives the outputs of the NOR gates 834 and 836 and sends its output signal to the transfer gate 840. The transfer gates 841 and 842 receive data D, latched in the latch circuit 833.

In the "verify read determining operation in write mode", the control core circuit 140 sequentially selects the PMOSFETs 815, 817 and 819 with time delays and sequentially sends out the activate signals a, b and c in association with the selected PMOSFETs. When the PMOSFET 815 is selected, the activate signal a is sent to enable only the latch circuit 830. Consequently, the latch circuit 830 latches the data A as the comparison result based on the determination threshold voltage that has been produced by the PMOSFET 815. When the activate signal b is then sent in accordance with the selection of the PMOSFET 817, only the latch circuit 831 is enabled. Consequently, the latch circuit 831 latches the data B as the comparison result based on the determination threshold voltage that has been produced by the PMOSFET 817. When the activate signal c is then sent in accordance with the selection of the PMOSFET 819, the latch circuit 832 alone is enabled. As a result, the latch circuit 832 latches the data C as the comparison result based on the determination threshold voltage that has been produced by the PMOSFET 819.

The control core circuit 140 turns on the transfer gates 837 and 840 when all the latch circuits 830–832 latch data. At this time, the transfer gates 841 and 842 are kept disabled. In this manner, the transfer gate 837 supplies the output representing the upper bit HB of 4-value data to the output buffer 131, and the transfer gate 840 supplies the output representing the lower bit LB of the 4-value data to the output buffer 131.

In the "normal read determining operation", the control core circuit 140 sequentially selects the PMOSFETs 821, 823 and 825 with time delays and sequentially sends out the activate signals a, b and c in association with the selected PMOSFETs. When the PMOSFET 821 is selected, the activate signal a is sent to enable only the latch circuit 830. Consequently, the latch circuit 830 latches the data A as the comparison result based on the determination threshold voltage that has been produced by the PMOSFET 821. When the activate signal b is then sent in accordance with the selection of the PMOSFET 823, only the latch circuit 831 is enabled. Consequently, the latch circuit 831 latches the data B as the comparison result based on the determination threshold voltage that has been produced by the PMOSFET 823. When the activate signal c is then sent in accordance with the selection of the PMOSFET 825, the latch circuit 832 alone is enabled. As a result, the latch circuit 832 latches the data C as the comparison result based on the determination threshold voltage that has been produced by the PMOSFET 825. The control core circuit 140 enables the transfer gates 837 and 840 when all the latch circuits 830–832 latch data.

Table 5 below shows the relationship among the individual data values defined in FIG. 13 and the outputs HB and LB of the transfer gates 837 and 840.

TABLE 5

| Data A | Data B | Data C | HB | LB | Data Value |
|---|---|---|---|---|---|
| H | H | H | H | H | 11 |
| H | H | L | H | L | 10 |
| H | L | L | L | H | 01 |
| L | L | L | L | L | 00 |

In the "verify read determining operation in erase mode", the control core circuit 140 selects the PMOSFET 827 and sends out the activate signal d at the same time. This enables only the latch circuit 833. Then, the latch circuit 833 latches the data D as the comparison result based on the determination threshold voltage that has been produced by the PMOSFET 827. When the latch circuit 833 latches the data, the control core circuit 140 enables the transfer gates 841 and 842. At this time, the transfer gates 837 and 840 are kept disabled.

Table 6 below shows the relationship among the individual data values defined in FIG. 13 and the outputs HB and LB of the transfer gates 841 and 842.

TABLE 6

| Data | HB | LB | Erased Status |
|---|---|---|---|
| H | H | H | Erased (11) |
| L | L | L | Unerased (00) |

In the above-described fifth embodiment, the provision of the single differential amplifier 807 minimizes the number of required differential amplifiers, which has conventionally been equal to the number of threshold values for normal determination (seven in this case), to ensure the reduction of the circuit scale.

In the fifth embodiment, the determination threshold voltage of the differential amplifier 807 may be obtained by changing the number of PMOSFETs instead of changing the sizes of the PMOSFETs connected to the I-V converter 4. For example, in place of the PMOSFET 823, PMOSFETs, the quantity of which is 1.5 times the number of the PMOSFETs 821, may be connected in parallel. If two PMOSFETs 821 are used in the differential amplifier 807, three PMOSFETs 821 are used in place of the PMOSFET 823. This structure provides the determination threshold value corresponding to the threshold value R2 and the determination threshold value corresponding to the threshold value R1 in the differential amplifier 807.

It should be apparent to those skilled in the art that the present invention may be embodied in many other specific forms without departing from the spirit or scope of the invention. Particularly, it should be understood that the invention may be embodied in the following forms.

(1) In the first to fifth embodiments, the invention may be adapted to a flash EEPROM, which is designed such that data consisting of three or more bits is stored in a single memory cell 101 or 201.

(2) In the first to fifth embodiments, the invention may be adapted to the split gate memory cell 110 source S of which serves as a drain and whose drain D serves as a source.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device having a plurality of data reading operation modes, comprising:
    a plurality of memory cells for storing data having predetermined values;
    a reference cell, wherein a current is permitted to flow in said memory cells and said reference cell when a predetermined voltage is applied thereto;
    a comparator, located between said memory cells and said reference cell, for producing an actual signal substantially equivalent to a value of a current flowing in each of said memory cells and a reference signal substantially equivalent to a value of a current flowing in said reference cell and comparing said actual and reference signals with each other to output a comparison result signal in each of said data reading operation modes; and
    a discriminator, coupled to said comparator, for discriminating a data value stored in each of said memory cells based on said comparison result signal, said discriminator including a circuit shared for discrimination of a data value in each of said data reading operation modes.

2. The semiconductor memory device according to claim 1, wherein said memory cells store data having multi values, and said comparator outputs said comparison result signal as a signal representing one value of the data stored in an associated memory cell.

3. The semiconductor memory device according to claim 1, wherein said comparator includes a circuit for producing a threshold value, which is used for comparison, from said reference signal.

4. The semiconductor memory device according to claim 1, wherein said comparator includes a plurality of comparator circuits having determination threshold values associated with each of said data reading operation modes and different from one another.

5. The semiconductor memory device according to claim 4, wherein each of said comparator circuits includes a circuit for producing a threshold value for comparison from said reference signal.

6. The semiconductor memory device according to claim 4, wherein said plurality of comparator circuits are arranged in parallel between said memory cells and said reference cell.

7. The semiconductor memory device according to claim 4, wherein a single reference cell is shared for said plurality of comparator circuits.

8. The semiconductor memory device according to claim 4, wherein each of said comparator circuits includes an amplifier for producing a determination threshold value from said reference signal and for determining whether said actual signal is greater than said determination threshold value.

9. The semiconductor memory device according to claim 4, wherein said plurality of comparator circuits are configured for discrimination of $2^n$-value data, and said discriminator includes a logic circuit group for receiving a comparison result signal from an associated one of said comparator circuits in each of said data reading operation modes and for converting said received comparison result signal to n-bit data.

10. The semiconductor memory device according to claim 1, wherein said comparator includes a circuit for, while said discriminator is discriminating a data value in one of said data reading operation modes, inhibiting a supply of comparison result signals associated with the other data reading operation modes to said discriminator.

11. The semiconductor memory device according to claim 1, wherein said comparator includes a plurality of comparator circuits for performing comparison operations in individual data reading operation mode.

12. The semiconductor memory device according to claim 11, wherein said comparator includes a circuit for enabling one of said comparator circuits that is associated with one of said data reading operation modes and disabling those comparator circuits associated with the remaining data reading operation modes.

13. The semiconductor memory device according to claim 1, wherein said reference cell is fabricated to have the same size as said memory cells.

14. The semiconductor memory device according to claim 1, wherein said reference cell is formed in the same process as said memory cells.

15. The semiconductor memory device according to claim 1, wherein said memory cells are formed on a semiconductor substrate, and each of said memory cells includes a floating gate located over said semiconductor substrate, a control gate capacitively coupled to said floating gate, a source, a drain and a channel, said source, said drain and said channel being defined on said semiconductor substrate.

16. A semiconductor memory device having a plurality of data reading operation modes, comprising:
   a plurality of memory cells for storing data;
   a reference cell having a same size as said memory cells, wherein a current is permitted to flow in said memory cells and said reference cell when a predetermined voltage is applied thereto; and
   a comparator, located between said memory cells and said reference cell, for producing an actual signal substantially equivalent to a value of a current flowing in each of said memory cells and a reference signal substantially equivalent to a value of a current flowing in said reference cell and for comparing said actual and reference signals with each other to output a comparison result signal in each of said data reading operation modes, said comparator including a comparator circuit that is shared for each of said data reading operation modes, for generating and comparing said actual and reference signals with each other.

17. The semiconductor memory device according to claim 16, wherein said memory cells store multi-value data, and said comparator outputs said comparison result signal as a signal representing one value of the multi-value data stored in an associated memory cell.

18. The semiconductor memory device according to claim 16, wherein said comparator circuit includes a plurality of circuits, which correspond to said data reading operation modes, for generating threshold values for comparison from said reference signal.

19. The semiconductor memory device according to claim 16, wherein said memory cells store multi-value data, said comparator including a plurality of comparator circuits, which are used for determining the values of the data in each of said data reading operation modes, for generating determination threshold values different from one another, each of said comparator circuits being shared in each of said data reading operation modes.

20. The semiconductor memory device according to claim 19, wherein each of said plurality of comparator circuits includes a plurality of generator circuits, which correspond to said data reading operation modes, for generating threshold values for comparison with said reference signal.

21. The semiconductor memory device according to claim 19, said comparator includes an enabling circuit for selectively enabling said plurality of generator circuits so that a generating circuit associated with each of said data reading operation modes is operable.

22. The semiconductor memory device according to claim 19, wherein each of said comparator circuits includes an amplifier for producing a determination threshold value from said reference signal and for determining whether said actual signal is greater than said determination threshold value.

23. The semiconductor memory device according to claim 19, wherein said plurality of comparator circuits are arranged in parallel between said memory cells and said reference cell.

24. The semiconductor memory device according to claim 19, wherein a single reference cell is shared for said plurality of comparison circuits.

25. The semiconductor memory device according to claim 19, further comprising a discriminator, coupled to said comparator, for discriminating a value of data stored in each of said memory cells based on said comparison result signal.

26. The semiconductor memory device according to claim 25, wherein said plurality of comparator circuits are configured for the discrimination of $2^n$-value data, and said discriminator includes a logic circuit group for receiving a comparison result signal from an associated one of said comparator circuits in each of said data reading operation modes and for converting said received comparison result signal to n-bit data.

27. The semiconductor memory device according to claim 25, wherein said logic circuit group is shared for discrimination of a value of data in each of said data reading operation modes.

28. The semiconductor memory device according to claim 16, wherein said reference cell is formed in the same process as said memory cells.

29. The semiconductor memory device according to claim 16, wherein said memory cells are formed on a semiconductor substrate, and each of said memory cells includes a floating gate located over said semiconductor substrate, a control gate capacitively coupled to said floating gate, a source, a drain and a channel, said source, said drain and said channel being defined on said semiconductor substrate.

30. A semiconductor memory device for writing multi-value data, comprising:
   a plurality of memory cells for storing multi-value data;
   a reference cell having a same size as said memory cells, a current being permitted to flow in said memory cells and said reference cell when a predetermined voltage is applied thereto; and
   a comparator, located between said memory cells and said reference cell, for producing an actual signal equivalent to a value of a current flowing in each of said memory cells and a reference signal equivalent to a value of a current flowing in said reference cell and comparing said actual and reference signals with each other to output a comparison result signal in a data reading mode, said comparator including:
      a plurality of generator circuits for generating threshold values used for determination of the values of multi-value data; and
      a comparator circuit, coupled to said plurality of generator circuits, for comparing said threshold values and said actual signal and outputting a comparison result signal as a signal representing one value of the multi-value data stored in each of said memory cells.

31. The semiconductor memory device according to claim 30, wherein the number of said plurality of generator circuits is set to allow discriminating of multi-value data.

32. The semiconductor memory device according to claim 31, wherein said plurality of generator circuits are arranged in parallel as viewed from said comparator circuit.

33. The semiconductor memory device according to claim 31, wherein said plurality of generator circuits are arranged in parallel as viewed from said reference memory cell.

34. The semiconductor memory device according to claim 30, wherein said comparator includes an enabling circuit for enabling said plurality of comparator circuits in step-like manner.

35. The semiconductor memory device according to claim 30, having a plurality of reading operation modes, said plurality of generator circuits divided into a plurality of generator circuit groups corresponding to said plurality of reading operation modes.

36. The semiconductor memory device according to claim 30, said comparator including a switching circuit for selectively switching said plurality of generator circuit groups to enable a generator circuit group associated with one of said plurality of reading operation modes.

37. The semiconductor memory device according to claim 30, wherein said reference cell is formed in the same process as said memory cells.

38. The semiconductor device according to claim 30, wherein said memory cells are formed on a semiconductor substrate, and each of said memory cells includes a floating gate located over said semiconductor substrate, a source, a drain and a channel, said source, said drain and said channel being defined on said semiconductor substrate.

39. The semiconductor memory device according to claim 30, further comprising a discriminator, coupled to said comparator, for discriminating a value of data stored in each of said memory cells based on said comparison result signal.

40. The semiconductor memory device according to claim 39, wherein said plurality of generator circuits are configured to generate a plurality of threshold values for the discrimination of $2^n$-value data, said comparator circuit sequentially outputting comparison result signals for $2^n$-value data, and said discriminator includes a logic circuit group for sequentially receiving comparison result signals from said comparator circuit in each of said data reading operation modes and converting said received comparison result signal to n-bit data.

41. The semiconductor memory device according to claim 39, wherein said logic circuit group is shared for discrimination of a data value in each of said data reading operation modes.

42. A semiconductor memory device writing multi-value data and reading written data in a plurality of data reading operation modes, comprising:
 a plurality of memory cells for storing multi-value data, the data stored in each memory cell having one of the multi values;
 a reference cell having a same size as said memory cells, wherein a current is permitted to flow in said memory cells and said reference cell when a predetermined voltage is applied thereto;
 a comparator, located between said memory cells and said reference cell, for receiving a current flowing in each of said memory cells and a current flowing in said reference cell and comparing both currents to output comparison signals representing the multi-values of stored data in each of said data reading operation modes; and
 a discriminator, coupled to said comparator, for discriminating a data value stored in each of said memory cells based on said comparison signals, said discriminator including a converter circuit for discrimination of a data value in each of said data reading operation modes, for converting said comparison signals to data.

43. The semiconductor memory device according to claim 42, wherein said data reading operation modes includes a normal data reading operation mode for data reading, a verify data reading operation mode for data writing and a verify data reading operation mode for data erasing.

44. A semiconductor memory device writing multi-value data and reading written data in a plurality of data reading operation modes, comprising:
 a plurality of memory cells for storing multi-value data;
 a reference cell having a same size as said memory cells, wherein a current is permitted to flow in said memory cells and said reference cell when a predetermined voltage is applied thereto; and
 a plurality of comparator circuits, located between said memory cells and said reference cell, for receiving a current flowing in each of said memory cells and a current flowing in said reference cell and for comparing both currents to output comparison signals representing the multi values of stored data in each of said data reading operation modes, each of said comparator circuits, which are shared in each of said data reading operation modes, generating a memory cell current signal and selectively generating a threshold value from a current flowing in said reference cell, said threshold value being used for a present data reading operation mode, each of said comparator circuits further comparing said memory cell current and threshold value to output a comparison signal.

45. The semiconductor memory device according to claim 44, whereon said data reading operation modes include a normal data reading operation mode for data reading, a verify data reading operation mode for data writing and a verify data reading operation mode for data erasing.

46. A semiconductor memory device writing multi-value data and reading written data in a plurality of data reading operation modes, comprising:
 a plurality of memory cells for storing multi-value data;
 a reference cell having a same size as said memory cells, wherein a current is permitted to flow in said memory cells and said reference cell when a predetermined voltage is applied thereto; and
 a comparator, located between said memory cells and said reference cell, for receiving a current flowing in each of said memory cells and a current flowing in said reference cell and comparing both currents to output comparison signals representing the multi values of stored data in each of said data reading operation modes, said comparator including:
  a plurality of generator circuits for generating a memory cell current signal and sequentially generating one or more threshold values from the current flowing in said reference cell, said one or more threshold values corresponding to a present data reading operation mode; and
  a comparator circuit, coupled to said plurality of generator circuits, for sequentially comparing said memory cell current signal and said one or more threshold values and outputting a signal representing multi values of data stored in each of memory cells.

47. The semiconductor memory device according to claim 46, wherein said data reading operation modes include a normal data reading operation mode for data reading, a verify data reading operation mode for data writing and a verify data reading operation mode for data erasing.

48. A method for determining multi-value data stored in a semiconductor memory device, comprising the steps of:

providing a reference cell, wherein a first signal is generated when a first predetermined voltage is applied to said reference cell;

providing a plurality of memory cells for storing multi-value data, wherein a second signal is generated when a second predetermined voltage is applied to one of said memory cells;

scaling said first signal to a plurality of determination thresholds; and, comparing said second signal to said plurality of determination thresholds, wherein said first and second signals are at least one of a voltage signal and a current signal.

* * * * *